(12) United States Patent
Lin

(10) Patent No.: US 9,799,573 B2
(45) Date of Patent: Oct. 24, 2017

(54) METHOD AND APPARATUS FOR BOND-PAD CHARGING PROTECTION OF REFERENCE TRANSISTOR TEST STRUCTURES

(71) Applicant: Wallace W Lin, San Jose, CA (US)

(72) Inventor: Wallace W Lin, San Jose, CA (US)

( * ) Notice: Subject to any disclaimer, the term of this patent is extended or adjusted under 35 U.S.C. 154(b) by 0 days.

(21) Appl. No.: 15/068,828

(22) Filed: Mar. 14, 2016

(65) Prior Publication Data
US 2016/0276229 A1    Sep. 22, 2016

Related U.S. Application Data

(60) Provisional application No. 62/177,596, filed on Mar. 20, 2015.

(51) Int. Cl.
| | |
|---|---|
| *H01L 23/58* | (2006.01) |
| *H01L 21/66* | (2006.01) |
| *H01L 27/06* | (2006.01) |
| *H01L 27/02* | (2006.01) |
| *H01L 23/525* | (2006.01) |

(52) U.S. Cl.
CPC ............ *H01L 22/14* (2013.01); *H01L 22/32* (2013.01); *H01L 27/0248* (2013.01); *H01L 27/0255* (2013.01); *H01L 27/0617* (2013.01); *H01L 23/5256* (2013.01)

(58) Field of Classification Search
CPC ....... H01L 2924/00014; H01L 2924/00; H01L 2924/0002; H01L 22/14; H01L 2224/48227
USPC ............................................ 257/48; 438/11
See application file for complete search history.

(56) References Cited

U.S. PATENT DOCUMENTS

| | | | |
|---|---|---|---|
| 8,896,034 B1 * | 11/2014 | Vorhaus ............... | H01L 27/0207 257/256 |
| 2003/0148558 A1 * | 8/2003 | Kubo ................. | H01L 21/76838 438/128 |
| 2011/0063764 A1 * | 3/2011 | Barrow ............... | H01L 27/0262 361/56 |

\* cited by examiner

*Primary Examiner* — Andy Huynh

(57) ABSTRACT

A method for preparing a reference transistor test structure having a transistor with multiple terminals is provided. The method may include placing a set of bond pads at a first layer of the reference transistor test structure with each of the bond pads connecting to its corresponding terminal of the transistor, wherein the first layer of the reference transistor test structure is an uppermost metal layer. The method may further include placing a first protection device at a second layer of the reference transistor test structure and connecting the first protection device to at least one of the terminals of the transistor, wherein the second layer is a lowermost metal layer.

20 Claims, 25 Drawing Sheets

| Group | BondPad@G | BondPad@S | BondPad@D | BondPad@NW |
|---|---|---|---|---|
| #1 | Grounded | Floating | Floating | Floating |
| #2 | Grounded | Grounded | Grounded | Grounded |

Fig. 1

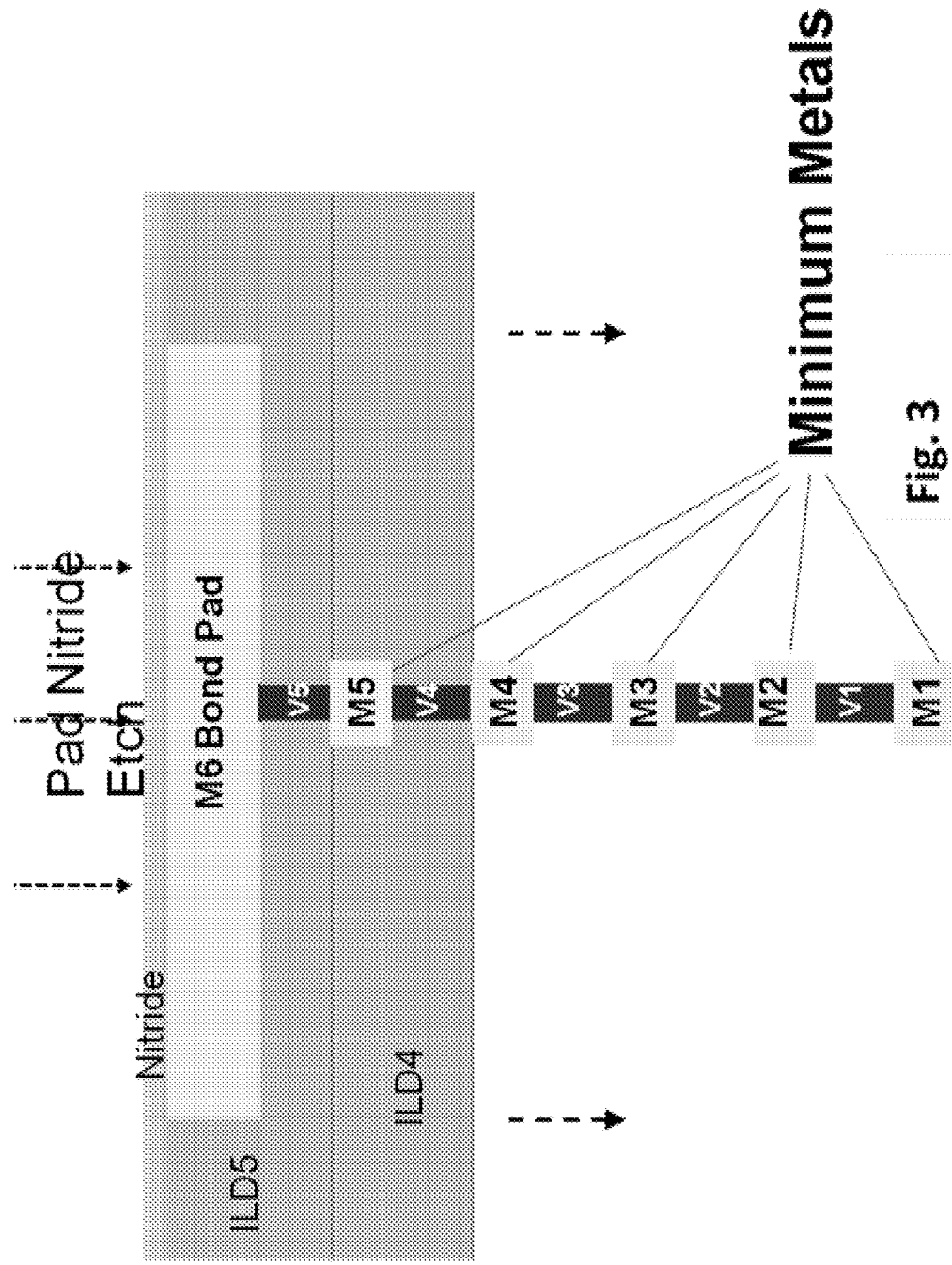

| Group | $V_G$ | $V_S$ | $V_D$ | $V_C$ | $V_{NW}$ | $V_{GS}$ | $V_{GD}$ | $V_{GC}$ | $V_{GNW}$ |
|---|---|---|---|---|---|---|---|---|---|
| #1 | -0.37 | -6.37 | -6.37 | ~0 | 0 | 6 | 6 | ~-0.37 | -0.37 |
| #2 | -0.37 | -0.37 | -0.37 | ~-0.37 | 0 | 0 | 0 | 0 | -0.37 |

Fig. 7

| Group | $V_G$ | $V_S$ | $V_D$ | $V_C$ | $V_{NW}$ | $V_{GS}$ | $V_{GD}$ | $V_{GC}$ | $V_{GNW}$ |
|---|---|---|---|---|---|---|---|---|---|
| #1 | 0.38 | 6.38 | 6.38 | 6.38 | 7.18 | -6 | -6 | -6 | -6.8 |
| #2 | 0.37 | 0.37 | 0.37 | ~0.37 | 0.37 | 0 | 0 | ~0 | 0 |

Fig. 11

METHOD AND APPARATUS FOR BOND-PAD CHARGING PROTECTION OF REFERENCE TRANSISTOR TEST STRUCTURES

CROSS-REFERENCE TO RELATED APPLICATION

This application claims the benefit of U.S. Provisional Application No. 62/177,596, filed on Mar. 20, 2015.

BACKGROUND

1. Technical Field

The present disclosure is directed to a method and apparatus that enable an optimum bond pad design for charging-free reference transistor test structures while also taking into account both measurement accuracy and minimum layout space usage.

2. Description of Related Art

Transistor test structures are indispensable in monitoring health of transistors during integrated-circuit (IC) process technology development. However, the size of bond pads required in these test transistors for the measurement purpose is usually quite large, easily introducing strong process charging effect to degrade transistor characteristics during the back-end (BE) IC manufacturing process. This could differentiate characteristics of the transistor test structures from those of the transistors in circuits. The above is particularly true for thick gate-oxide test transistors operating at medium to high chip operation supply voltages in the I/O portion of the circuits. These transistors have gate oxide thickness typically ranging from 40 to 150 Å in order to sustain the higher voltages during the chip operation. They, however, are more vulnerable to the charging damage during the plasma-involved backend IC manufacturing process compared to thin gate-oxide transistors operating at low chip operation supply voltages.

Among transistor-based test structures, reference transistor test structures, due to their significant importance worth further discussion. The reference transistor test structures are essential in monitoring transistor health issues because they serve as a clean benchmark for test structures designed in accordance with specifications (i.e., transistors with various process or device designs). With the reference transistor test structures, performance evaluation for the test structures designed pursuant to the specifications could be accomplished.

The reference transistor test structures must be maintained clean and uncontaminated from the time of their formation in front-end (FE) process until they are tested after end-of-line (EOL). As such, clean transistor basic characteristics such as the parameters of threshold voltage, drive current, off-state leakage, etc. during electrical test (E-test) could be provided.

In order to fend off the charging effect, the reference transistor test structures are traditionally protected at their gates with protection diodes (i.e., junction diodes or gated diodes) at the bond-pad metal layer to prevent charging damage caused by the large-size gate bond pads, and to protect gate oxides. Nonetheless, it has been observed that such arrangement may not always work, and in some case even backfire.

Therefore, the bond pad design for the "charging-free" reference transistor test structures is important and should deserve attention. This present disclosure is the first step in an effort toward the goal of achieving a better bond pad design for the transistor test structures designed for various transistor-health monitoring applications.

SUMMARY

This disclosure presents a method and apparatus for test-structure bond-pad charging protection which will be beneficial to transistor test structure designers in the IC industry. The disclosure aims at achieving a bond-pad design for the reference transistor test structures such that these structures will be completely immune from the plasma charging damage during the plasma-involved BE IC manufacturing process.

The present disclosure simultaneously protects all terminals of the reference transistors. It discloses an optimum bond-pad charging protection design to ensure the reference transistor test structures to be truly charging-free during the BE IC process while also resulting in both minimum usage in layout space and minimum gate oxide stress in fuse zap-off process.

This disclosure could be verified by experiments carried out by a 6-metal-layer CMOS process technology. It could be also verified with simulations performed by a transistor plasma charging evaluator which, based on both the multiple-terminal transistor charging and the Inter-(Metal) Layer-Dielectric (ILD) charging models, is able to reconstruct the terminal condition of the reference transistor test structures at the threshold of transistor gate oxide degradation during charging events in a given process/device technology. The transistor plasma charging evaluator may also predict the location of degradation in terms of the simulated maximum inter-terminal voltage drops.

For further understanding of the present disclosure, reference is made to the following detailed description illustrating the embodiments and examples of the present disclosure. The description is only for illustrating the present disclosure, not for limiting the scope of the claim.

BRIEF DESCRIPTION OF THE DRAWINGS

The drawings included herein provide further understanding of the present disclosure. A brief introduction of the drawings is as follows:

FIG. 1 shows bond-pad configuration of Group-1 and Group-2 P-MOSFET test transistors with top-metal-layer bond pads according to one embodiment of the present disclosure;

FIG. 3 shows a cross-sectional view of the bond pad region of the Group-1 and Group-2 reference transistor test structures undergoing pad nitride etch process according to one embodiment of the present disclosure;

FIG. 7 shows simulated terminal voltages (in volt) and inter-terminal voltage drops of the two P-MOSFET transistor test structure groups described in FIG. 1 during a negative charging event with $A_G=A_D=A_S=A_{NW}=10000$ μm$^2$ at $M_6$ according to one embodiment of the present disclosure;

FIG. 11 shows simulated terminal voltages (in volt) and inter-terminal voltage drops of the two P-MOSFET test transistor groups described in FIG. 1 during a positive charging event with $A_G=A_D=A_S=A_{NW}=10000$ μm$^2$ at $M_6$;

DESCRIPTION OF THE EXEMPLARY EMBODIMENTS

The aforementioned and other technical contents, features, and efficacies will be shown in the following detailed descriptions of embodiments corresponding with the reference figures.

FIG. 1 shows bond-pad configuration of the P-MOSFET test transistors with top-metal-layer bond pads protected using the prior art and the present disclosure according to one embodiment thereof. The test transistors designed by the prior art are categorized as Group-1 and those designed by the presently disclosed art are referred to Group-2.

Experimental Verification

Experiments are conducted in examining the bond-pad charging effect of the reference transistor test structures. P-MOSFET test transistors are used in the experiments though other test transistors may be utilized in other embodiments. The transistor fabrication process may be using a 0.13-μm 6-metal-layer dual-gate CMOS technology with copper damascene interconnect patterning process. The gate oxide thickness of the P-MOSFET test structures is 60 Å in one embodiment. Each of the four terminals of the test transistors is connected with a full-size bond pad of 100 μm by 100 μm in size at the top Metal-6 ($M_6$) layer. The metals connected to the transistor terminals at all other metal layers below $M_6$ may be minimized. Therefore, these test structures may only become measurable at EOL of the fabrication process.

N-MOSFET based gated diode with grounded (i.e. connected to substrate) gate and source may serve as the protection device. The protection diode may help minimize the charging induced voltage buildup at the transistor terminal(s) to which it is attached. The protection devices may be connected to these terminals at the $M_6$ layer. Maximum-slope threshold voltages, used to monitor the gate oxide degradation, may be measured on the test structures at EOL after the protection devices are detached by having the fuses (i.e., poly fuses) located between the protection devices and the test structures zapped off.

Among the transistor test structures in FIG. 1: Group-1 test transistors are designed by a conventional method with their gate bond pads connected to their respective protection devices and their drains, sources and N-Well (NW) bond pads floating. Group-2 test transistors meanwhile may be with the transistors' gates, drains, sources and NW bond pads each connected to a protection device. Group-1 and Group-2 transistors have minimum metals connected to all transistor terminals from the lowest metal layer to the next highest metal layer with the bond pads at the highest (top) metal layer for EOL probing.

Figure 2A:
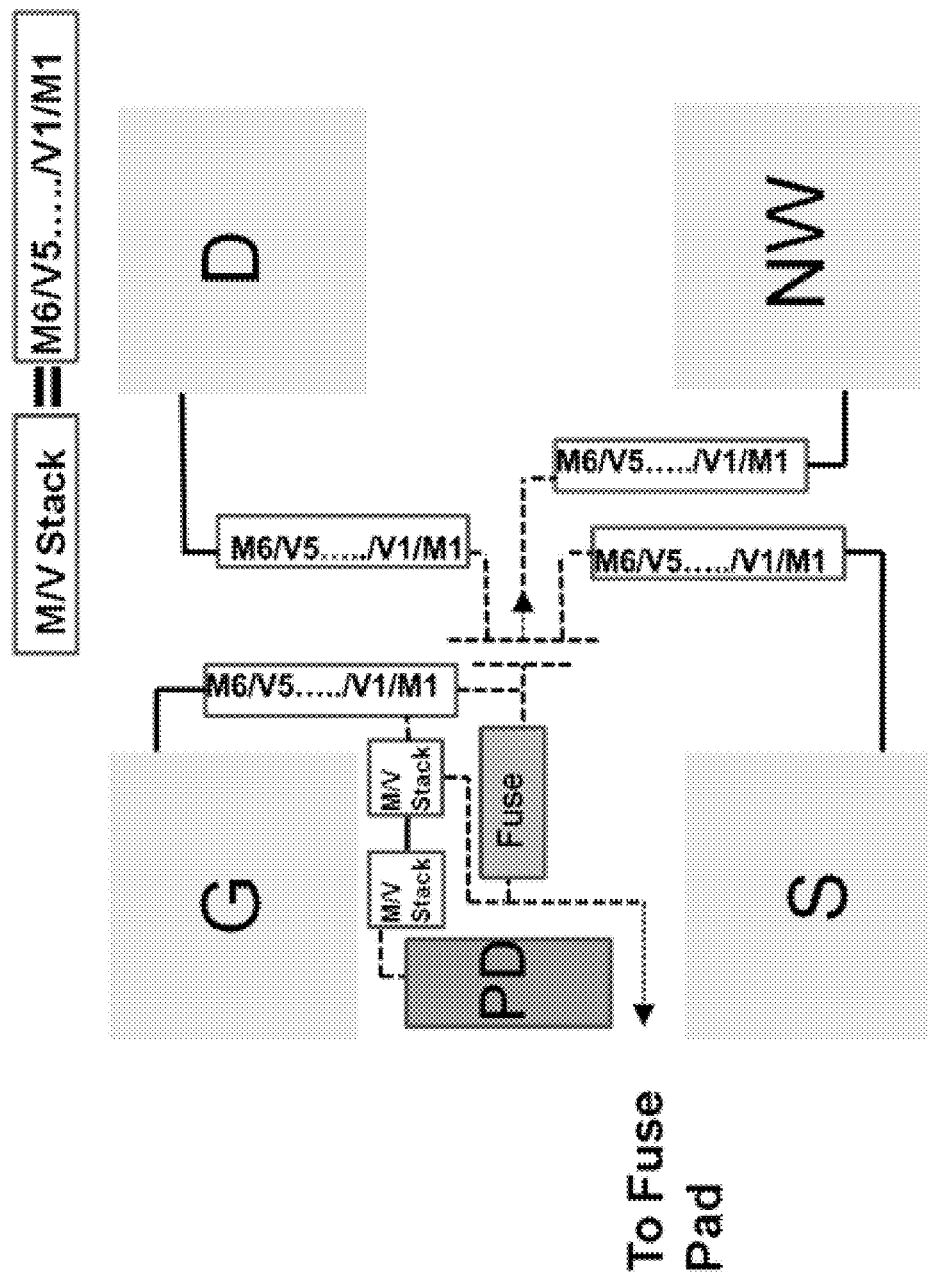
FIG. 2(a) shows a top view of the $M_6$ bond pads for Group-1 reference transistor test structures.

FIG. 2(a) shows the top view of the $M_6$ bond pads for Group-1 reference transistor test structures. One transistor, one protection device (PD), one poly fuse and the dotted lines are under $M_1$ layer. The solid lines are $M_6$ lines. A protection device (PD) is connected to the transistor gate at the highest metal layer to protect the bond pad charging. Four bond pads and the fuse pad are located at $M_6$ layer. Each of the four transistor terminals is connected to one bond pad through a metal contact and vias between $M_1$ and $M_5$ using minimum metal at $M_1$, $M_2$, $M_3$, $M_4$ and $M_5$. The poly fuse is connected between a transistor gate terminal and the PD. Both the PD and the poly fuse are connected to the one fuse pad at $M_6$ layer. In the conventional art, four fuse pads, four fuses, and four PDs are required for the four terminals. The fuse in one implementation may be implemented in terms of poly-silicon, which may be zapped off as it evaporates. Zapping off the fuse effectively may disconnect the terminal from PD. The transistor characterization may include having threshold voltages of the transistor measured. The fuse pad that supplies the current to zap off the fuse is not shown either in FIG. 2.

Figure 2B:
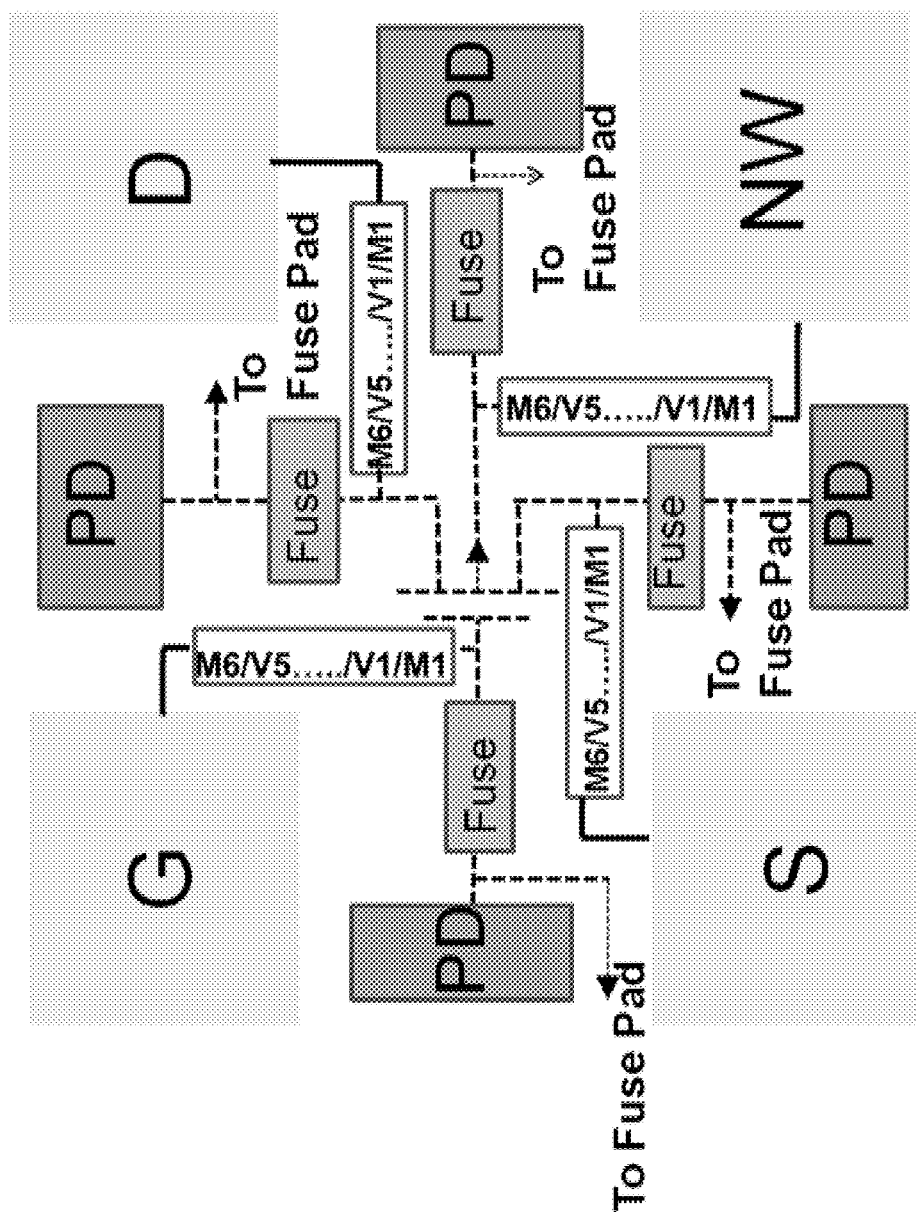
FIG. 2(b) shows a top view of the $M_6$ bond pads for Group-2 reference transistor test structures according to one embodiment of the present disclosure.
Figure 2C:
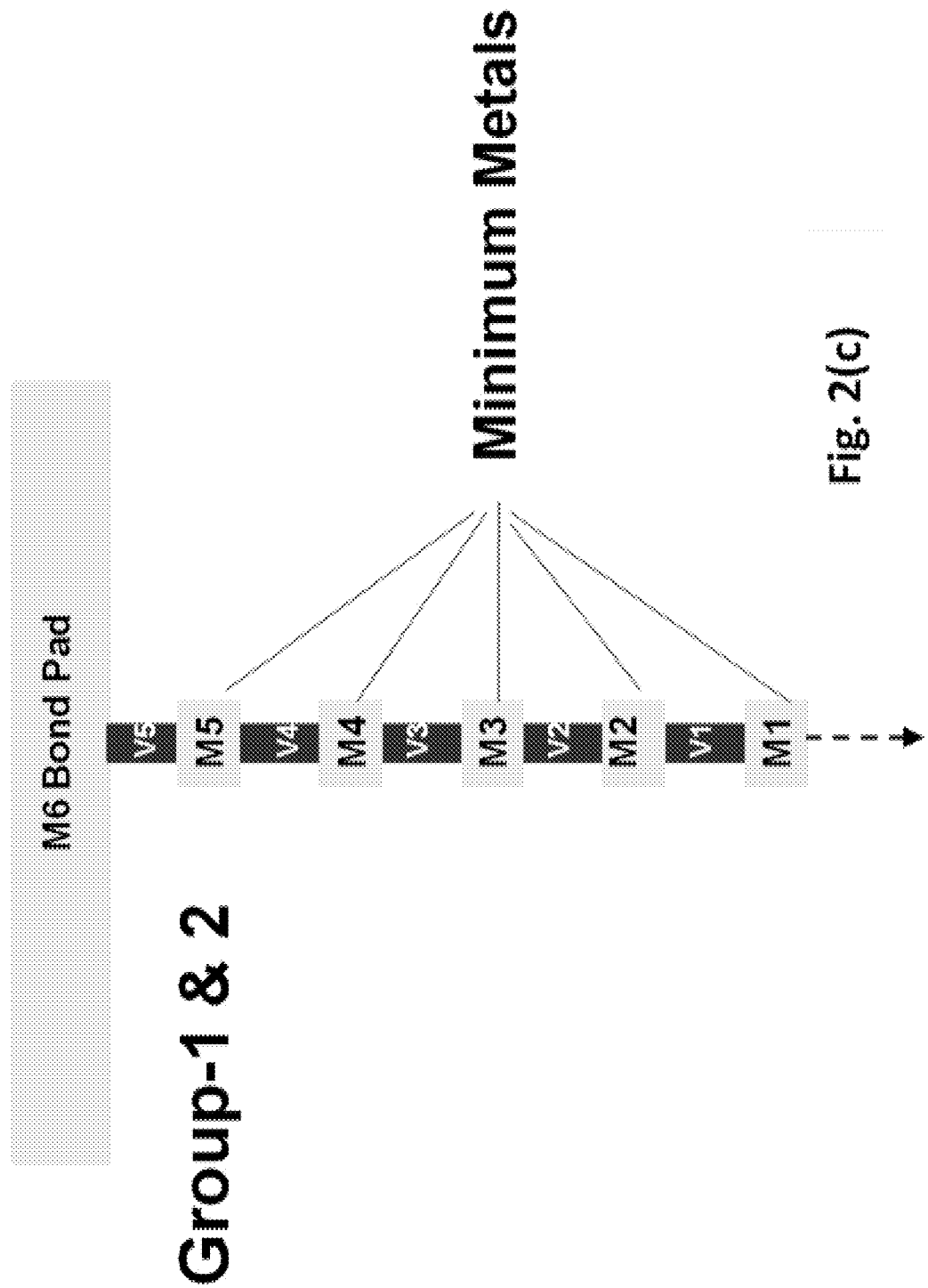
FIG. 2(c) shows a cross-sectional view of the bond pad regions of the Group-1 and Group-2 reference transistor test structures according to one embodiment of the present disclosure.

FIG. 2(b) shows the top view of the $M_6$ bond pads for the Group-2 reference transistor test structure according to one embodiment of the present disclosure. Group-2 transistors have all their four terminals protected. FIG. 2(c) shows the cross-sectional view of the bond pad regions of the Group-1 and Group-2 reference transistor test structures according to one embodiment of the present disclosure. The bond pad at the $M_6$ layer and minimum metals at the metal layers below are shown. Note that this cross-sectional illustration applies to all transistor terminals—the gate, source, drain and NW. The bond pads and the fuse pads are connected to the transistor terminals through the metal contact/via stack. The $M_1$ in the metal contact/via stack under the gate bond pad makes contact to the transistor gate terminal. The $M_1$ in the metal contact/via stack under the source bond pad makes contact to the transistor source terminal. The $M_1$ in the metal contact/via stack under the drain bond pad makes contact to the transistor drain terminal. The $M_1$ in the metal contact/via stack under the well bond pad makes contact to the well tap terminal. In a similar manner, each of the transistor terminals may be connected to one PD through one fuse. The cross-sectional view of the bond pad region of the Group-1 and Group-2 reference transistor test structures is also illustrated in FIG. 3 which shows an ongoing pad nitride etch process. The bond pad at the $M_6$ layer, minimum metals at the metal layers below, and ILD-4 and ILD-5 layers are also shown. For simplicity and the illustration purpose, the dimension (width and thickness) of the $M_6$ bond pad and the metals below, the vias and the ILDs are not scaled with the real dimension which follows the design rules.

Figure 4:
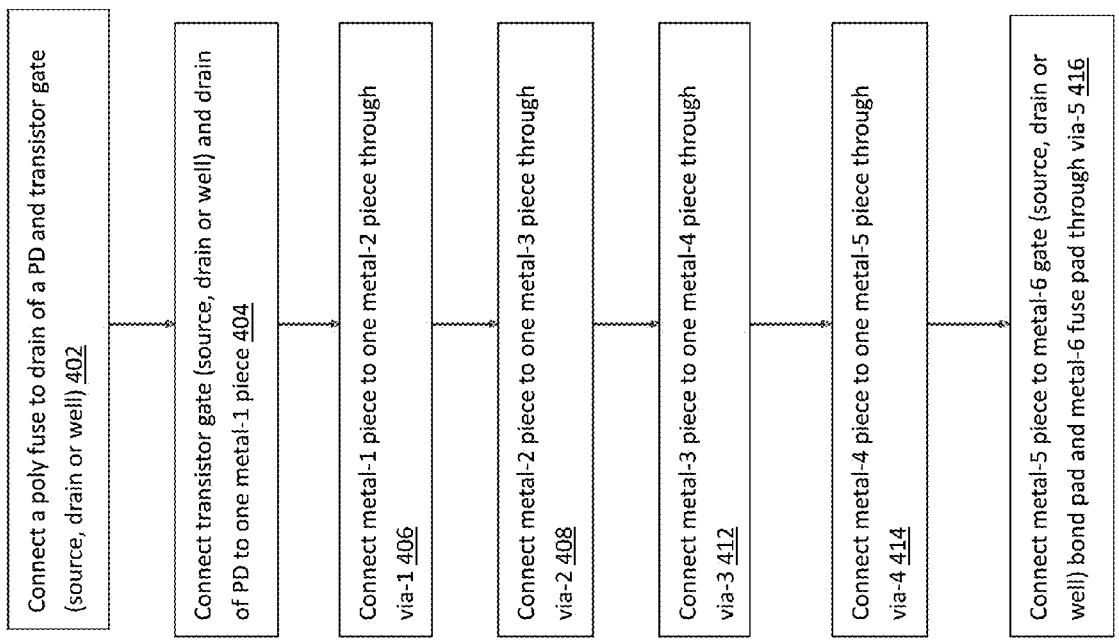
FIG. 4 shows a simplified block diagram of a flow of preparing the Group-2 reference transistor test structure according to one embodiment of the present disclosure.

FIG. 4 is a block diagram showing the flow of preparing a reference transistor test structure such as those at FIGS. 2(b) and 2(c) according to one embodiment of the present disclosure. The flow simultaneously applies to the bond pad design in the four bond pad regions. The flow starts after the formation of the transistor in a front-end process. First, a drain of an N-MOSFET-based PD is connected to a poly fuse which is then connected to one transistor terminal (gate, source, drain, or well) (step 402). The transistor terminal along with the drain of the PD may then be connected to the $M_1$ layer of the minimum amount of the metal defined by design rules (step 404). Please note that the metal-1 shown in FIG. 4 may refer to the $M_1$ layer. Similarly, metal-2 may refer to the $M_2$ layer. The PD therefore is connected at the $M_1$ layer and therefore may render possible the protection of this particular transistor terminal from beginning of a back-end process (i.e., beginning from the patterning process for $M_1$). The minimum $M_1$ piece is then connected to $M_2$ piece with the minimum amount of metal as well, through one via at the $M_1$ layer (for example, via-1 in FIG. 4 and shown in FIG. 2(c)) in step 406. Similar steps may proceed until the $M_5$ piece is connected to the bond pad at the $M_6$ layer through other vias. For example, the connection may be through via-2, via-3, via-4, and via-5, as shown in steps 408-416.

In step 416, the disclosed flow may include connecting the metal-5 piece to a gate, source, drain or well bond pad at the $M_6$ layer corresponding to the corresponding gate, source, drain or well tap terminal of the transistor with a corresponding fuse pad at the same $M_6$ layer.

Figure 5:
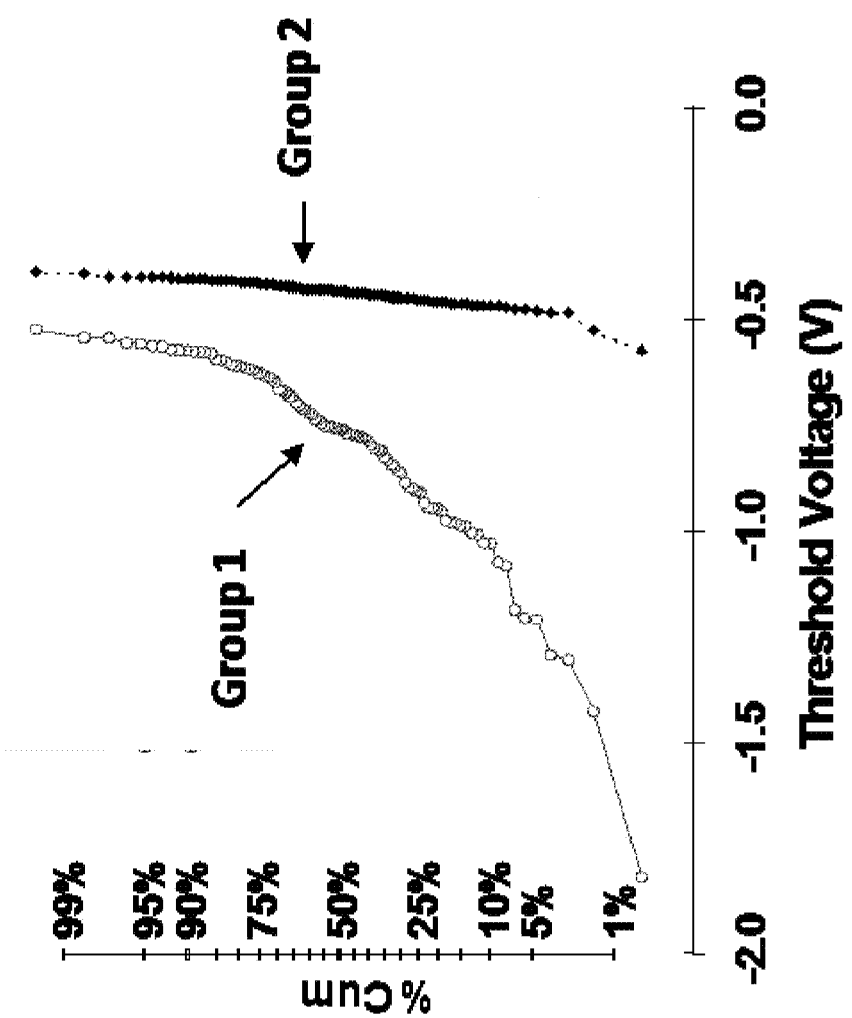
FIG. 5 shows experimental data of charging performance of the Group-1 and Group-2 reference transistor test structures according to one embodiment of the present disclosure.

Experimental data of the two test transistor groups is shown in FIG. 5. Group-2 reference test transistors show the better performance in the probability plot with the median threshold voltage meeting the target threshold voltage of −500 mV. However, Group-1 test structures show a very wide distribution with the median threshold voltage sitting around −800 mV.

The result of Group-1 transistors here indicates that the design by the prior art method which protects the gate bond pad only may not protect the transistors. The present disclosure on the other hand is better at protecting the reference transistor test structures from the bond-pad induced charging damage. The experimental data here also suggest that placing the protection device at the transistor gate may not always protect the transistor from the induced transistor charging.

Verification with Simulations Based on Physical Models

In modeling and simulating transistor charging behaviors, one needs to consider (i) the nature of plasma around a wafer inside the plasma equipment chamber during the back-end IC manufacturing process; and (ii) the physical models describing transistor charging phenomena. These considerations will be addressed in the following.

A. Plasma Non-Uniformity

During the back-end plasma involved ILD process, a DC (direct current) sheath would form between the plasma and the wafer with more positive potential toward the edge of the sheath close to the plasma due to much faster movement of the light-mass electrons to the wafer surface than the heavy ions. However, due to the imbalance between the plasma near the transistor terminals and near the wafer substrate, positive ("+") or negative ("−") plasma potential may be present at the transistor terminals relative to the wafer substrate. Since the size of each of the individual transistors is so tiny, it is reasonable to assume that locally the plasma is uniform and the same polarity and magnitude of the plasma potential are present at the terminals of an individual transistor. Whereas the plasma seen by the wafer substrate may far be located on the other side of the wafer or near the wafer edge where it usually forms the returning path for the plasma induced current flowing from the top surface of the wafer, where the transistor terminals are located, through the wafer substrate. Therefore, the plasma seen in the two regions may be far apart. For example, the plasma at the region where the terminals of a particular transistor are located on the top wafer surface and the plasma at the region of the wafer substrate at the wafer edge around a large piece of wafer inside the chamber of a given plasma processing equipment could be quite different and imbalanced due to the global plasma non-uniformity. The imbalance of the plasmas at the transistor terminals and the wafer substrate or the wafer edge can contribute to transistor gate oxide degradation during the back-end IC manufacturing process. Therefore, to completely model the transistor charging performance in the back-end IC manufacturing process, it is imperative to consider both positive and negative charging events so that all possible transistor charging behaviors can be captured and analyzed.

B. Physical Models

Two fundamental charging mechanisms dominating the transistor charging behaviors, the multiple-terminal transistor charging and the ILD charging, are incorporated in the modeling to simulate the charging performance of the two test structure groups for both positive and negative charging events. During the positive charging events, the P-MOSFET transistors may have the positive charge buildup at their gate, drain, source, and NW terminals. The transistors may have the negative charge buildup at their four terminals during the negative charging events.

Figure 6A:
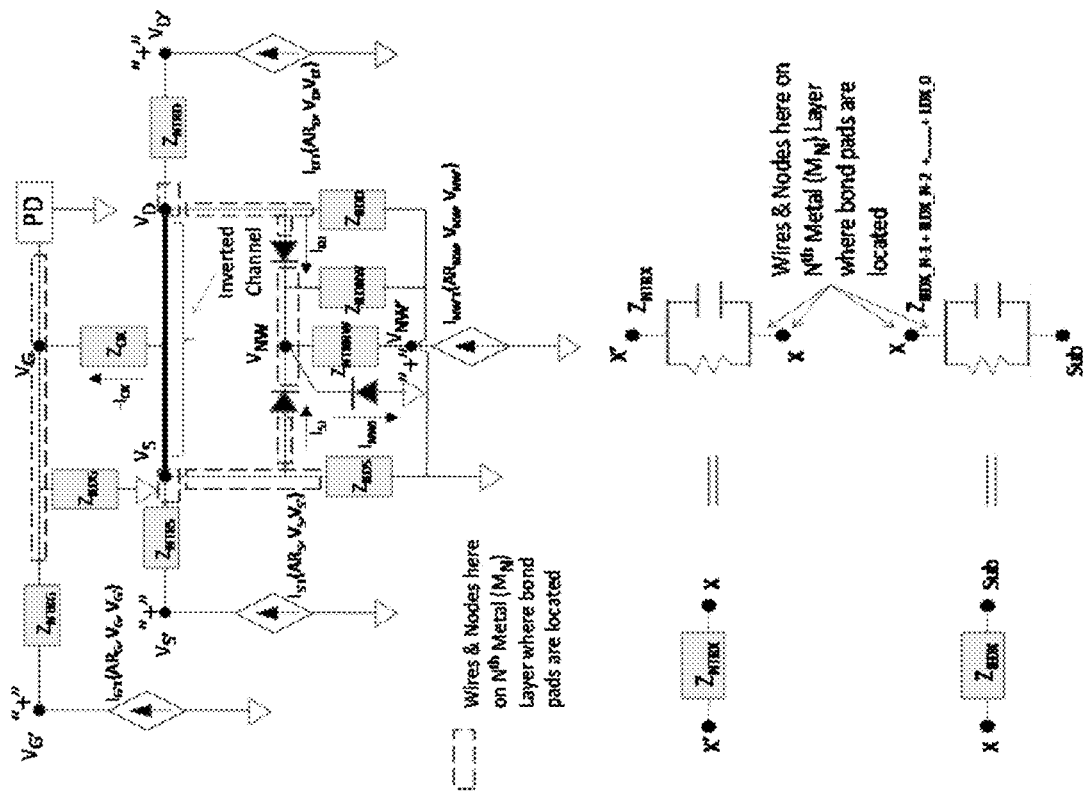
FIG. 6(a) shows an equivalent-circuit model taking into account the multiple-terminal transistor charging and the ILD charging mechanisms in a positive charging event according to one embodiment of the present disclosure.
Figure 6B:
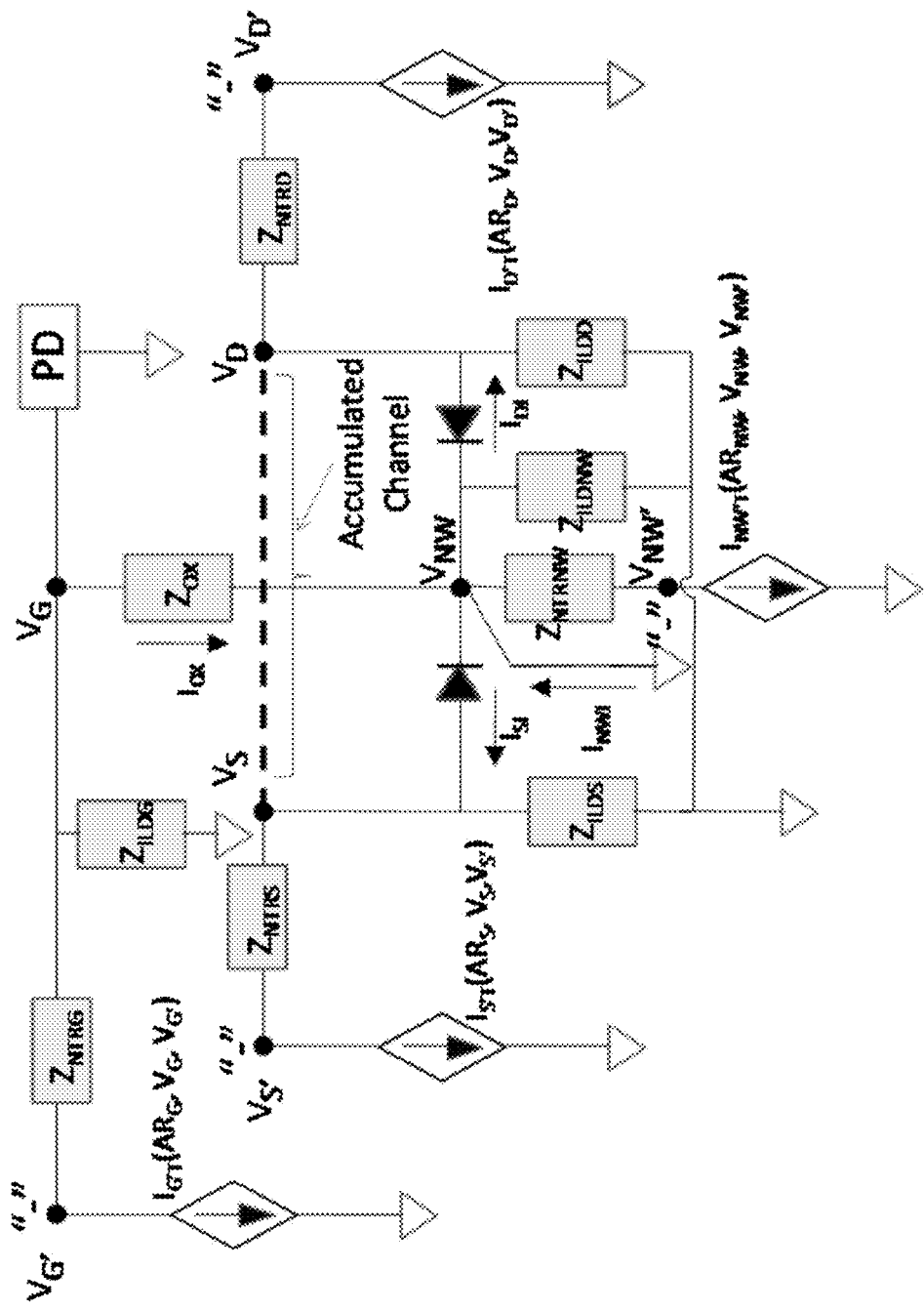
FIG. 6(b) shows an equivalent-circuit model taking into account the multiple-terminal transistor charging and the ILD charging mechanisms in a negative charging event according to one embodiment of the present disclosure.

FIGS. 6(a) and 6(b) show the equivalent-circuit models taking into account the two fundamental charging mechanisms in the positive and negative charging events, respectively, according to one embodiment of the present disclosure. The positive-charging equivalent circuit model in FIG. 6(a) reflects a gated-diode-protected PMOS transistor under the strong inversion condition (i.e., the gate potential is pulled down to be close to the substrate potential by the protection device (PD) and the source potential is maintained positive high due to the charge-up of the NW potential during the positive charging events).

The model shows interconnect dielectric components at transistor terminal nodes. The equivalent circuits here focus on the top metal layer where the bond pads exist. Thus, the equivalent circuit applies to $M_N$ layer for an N-metal-layer technology. It is important to note that unlike the lower metal layers no ILD process would be performed above the top-metal-layer bond pads. Instead, silicon nitride passivation deposition and pad-etch (i.e., nitride etch-back) process may take place before the EOL for assembly. For the top-metal-layer bond pads, the nitride layer above and the ILD layer(s) beneath are modeled as two impedances, $Z_{NTRX}$ and $Z_{ILDX}$, where X denotes transistor nodes, G (gate), S (source), D (drain) and NW. $Z_{ILDX}$ is defined as $Z_{ILDX\_N}+ \ldots +Z_{ILDX}$, respectively, for a given N-metal-layer technology. The X' node is the top surface of the nitride layer sitting on the $M_N$-layer bond pads connected at the transistor terminal node X during the nitride deposition and the etch-back process.

Incoming plasma charging currents are expressed as non-linear voltage-controlled current sources taking into account plasma loading characteristics at the transistor terminals. $AR_X$ in terms of the current source function is an antenna ratio at the transistor node X (=G, S, D or NW), defined as the ratio between the area of the $M_N$-layer bond pad at the transistor node X and the area of the transistor gate. We here focus on the worst-case charging scenario (i.e., the maximum voltage buildup at the transistor terminals) which occurs at the beginning of the nitride deposition or at the end of pad etch (or nitride etch-back) process. In such condition, because the bare metal is exposed to the plasma, the transistor gate oxides may be with the highest potential coupling effect from the plasma near the top surface of the wafer. As a result, $Z_{NTRX}$ at all transistor terminal nodes in FIGS. 5(a) and 5(b) can be replaced by a $M_N$-layer wire since it may be considered "shorted."

In the positive charging model, the source-to-NW (S-to-NW) and drain-to-NW (D-to-NW) junction diode can be either forward- or reverse-biased depending on the magnitude of the charged-up NW terminal potential. The negative-charging equivalent circuit model in FIG. 6(b) reflects a gated-diode protected PMOS transistor under the strong accumulation condition (i.e., the low potential at the gate and the high negative potential at the source). The accumulated channel is illustrated as the thick dotted line in FIG. 6(b). Because the current flowing between source and drain is very low, there is very weak or virtually no communication between the source and drain node. Under the negative charging events, the NW-to-substrate (NW-to-Sub) junction is forward-biased, shunting away the effect of the down impedance components, $Z_{ILDNW}$ at the NW node. As a result, the absorbed plasma charging current at the NW node are all dissipated into the substrate, and thus the NW metal size would be having no impact on the charging performance of the PMOS transistor.

All the simulations performed are based on the aforementioned worst-case-scenario model. The gate width and length were 10 μm and 0.4 μm respectively for the simulated P-MOSFET transistor. The gate oxide current characteristics are taken from the measurement data of the 60-Å gate oxides thickness. All ILD layers used in simulations could be 5000 Å in thickness. The S/D and NW areas are 14 μm² and 36 μm², respectively. The N-MOSFET gated diode connected at the gate of the test transistor gate is with W/L=10/0.2 μm. The S/D edge-intensive junction current component is $3\times10^{-17}$ Amp/μm and its area-intensive component is $5\times10^{-20}$ Amp/μm². The edge- and area-intensive NW junction current components are $10^{-19}$ Amp/μm and $2.9\times10^{-20}$ Amp/μm², respectively. These edge- and area-intensive junction current components are used to compute transistor internal S/D and NW junction currents.

The transistor channel current is computed with a compact transistor model tuned for the 0.13-μm process technology. For the plasma loading characteristics in the simulation, 10V is the open-circuit voltage ($V_{OC}$) or the maximum plasma potential, and the short-circuit charging current density ($J_{SC}$) or the maximum charging current density is $7.5\times10^{-6}$ Amp/cm². The current transport of the down ILD impedance component, $Z_{ILDX}$, is modeled with Frenkel-Poole conduction mechanisms in the form of $I_{ILDX}=C*V*e^{D*\sqrt{V_X}}$, where C is characterized to be around=$10^{-6}$ Amp/V-cm² and $$D = \sqrt{\frac{q}{\Pi \varepsilon_i d}} / \sqrt{\frac{kT}{q}},$$

where q is the elemental charge, $\varepsilon_i$ is permittivity of ILD oxide, k is Boltzmann constant, T is absolute temperature and d is thickness of the ILD oxide. The modeling is based on characterized data taking into consideration the effect of plasma illumination induced photoconductivity in ILD oxides. A software program that incorporates all the above models and mechanisms is coded in C language though other computer languages could be used as well. All simulation results are obtained through this program running at machines such as computers.

C. Simulation Approach

Unlike the underneath metal layers where the ILD process is the major plasma source causing the metal charging, the nitride deposition/etch-back process on top-metal-layer $M_6$ bond pads plays the major role in causing the $M_6$ charging. Particularly, the nitride etch-back or so-called pad-etch process (i.e., etching back for pad opening after nitride passivation which prevents contamination) has typically been a much stronger plasma charging source than the ILD deposition or etch-back process underneath the $M_6$ layer. The reasons include: (i) The nitride etch-back etches away the nitride all the way to the large-area pad metal while the ILD etch-back in damascene process etches down to the lower-layer metal only in the small via opening area, and (ii) The pad nitride etch-back (also deposition) step is performed on the top metal layer which incurs the higher plasma potential coupling to the transistor terminals due to the higher impedance between the transistor terminals and the wafer substrate. Thus, it makes sense that the worst-case-scenario simulations concentrate on the end of the $M_6$ pad-etch process in the present disclosure.

Since the plasma loading characteristics of the $M_6$ pad-etch process that the two test structure groups going through are not characterized at the time of the experiments are conducted, a strategy taken in the simulations here is described as follows: $J_{SC}$ and $V_{OC}$ are adjusted to see if the simulation response matches the gate oxide degradation threshold which is defined as the condition when the inter-terminal (i.e., between any two terminals located on two opposite sides of the transistor gate oxide) electrical field (i.e., the inter-terminal voltage drop divided by gate oxide thickness) exceeds 10 MV/cm. With this approach, the transistor terminal condition (i.e., the potentials at all transistor terminals) at the threshold of the gate oxide degradation can be reconstructed.

Negative-Charging Result

By varying $J_{SC}$ and $V_{OC}$, the present disclosure may determine that $7.5 \times 10^{-6}$ Amp/cm$^2$ of $J_{SC}$ and 10V of $V_{OC}$ could result in the inter-terminal electrical field (E-field) of 10 MV/cm as the E-field threshold of the gate oxide degradation for Group-1 transistors test structures.

The table in FIG. 7 summarizes the simulation result when area of the $M_6$ is at a full bond-pad size. Note that the zero-volt $V_{NW}$ in the two transistor groups is due to a forward-biased NW-to-sub junction forcing the absorbed plasma charges at the NW bond pad to be completely removed into wafer substrate. As a result, the transistor charging behaviors are independent of the area of the $M_6$ metal at the transistor NW terminal.

Figure 8A:
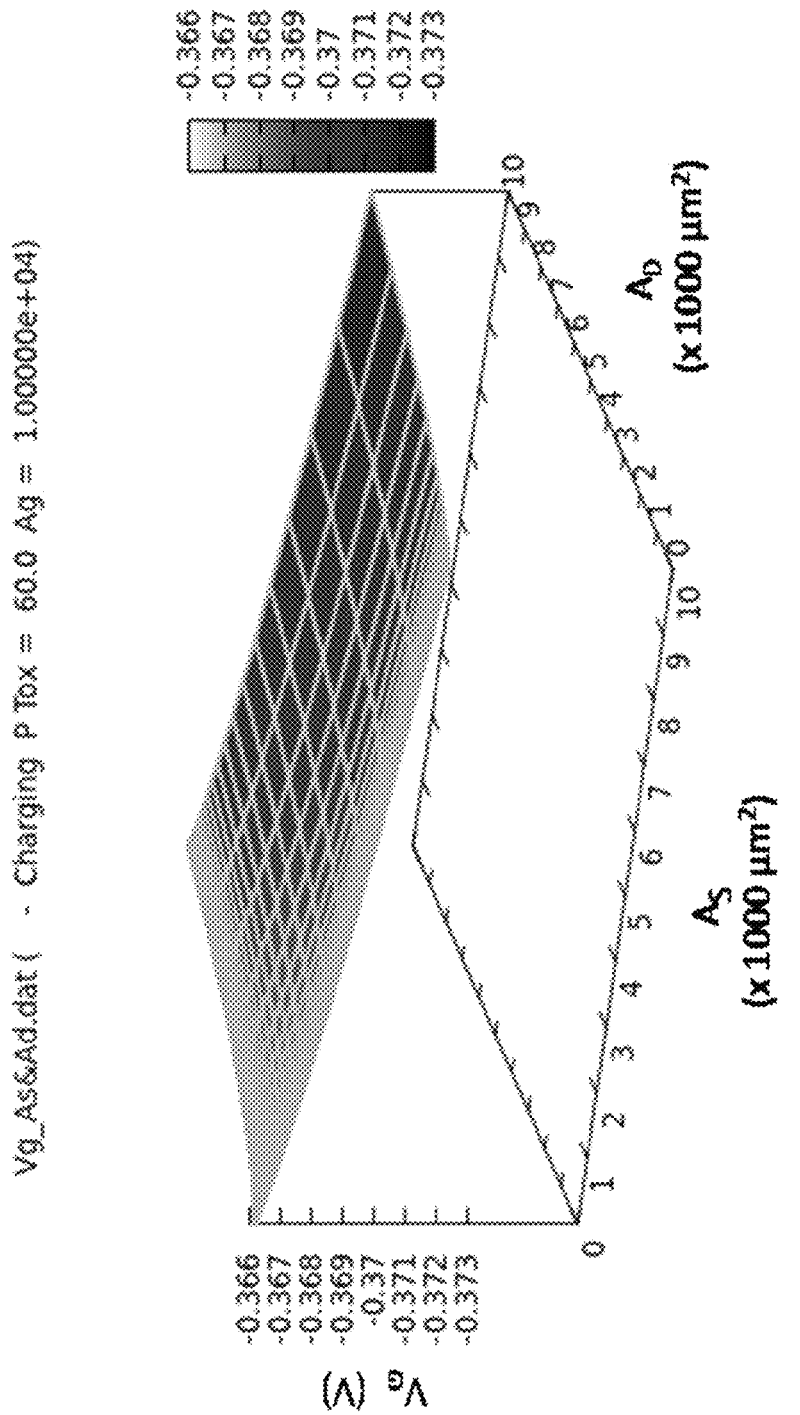
FIG. 8(a) shows simulated gate terminal potential ($V_G$) versus area of $M_6$ metal connected at source ($A_S$) and drain ($A_D$) of the Group-1 test transistor during a negative charging event according to one embodiment of the present disclosure.

The data in FIG. 7 show that placing the protection devices at the transistor terminals effectively lowers the voltage buildup at these terminals. For example, in Group-1 case as shown in FIG. 8(a), $V_G$ is effectively pulled down by the gated diode at the gate. $V_G$ increases very little as $A_S$ and $A_D$ increase.

Figure 8B:
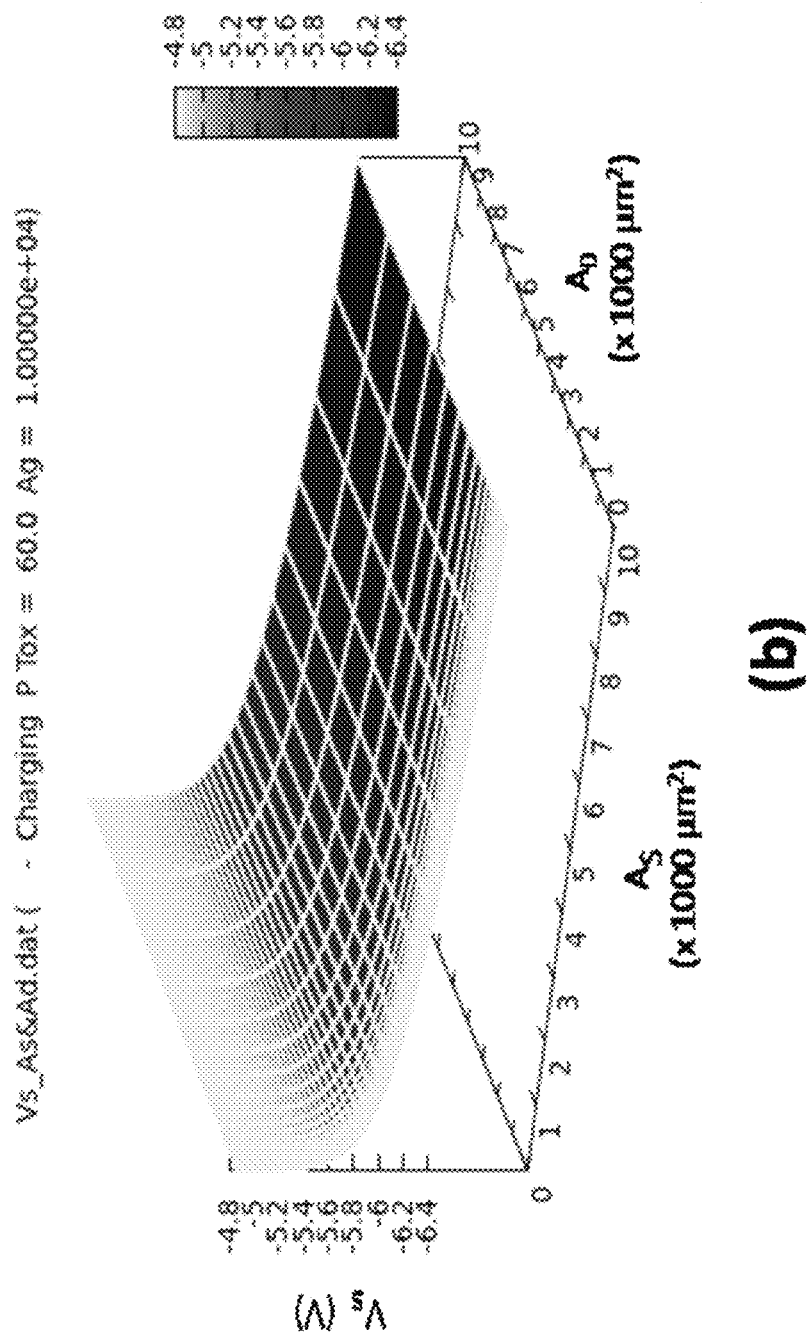
FIG. 8(b) shows simulated source terminal potential ($V_S$) versus area of $M_6$ metal connected at source ($A_S$) and drain ($A_D$) of the Group-1 test transistor during a negative charging event according to one embodiment of the present disclosure.
Figure 8C:
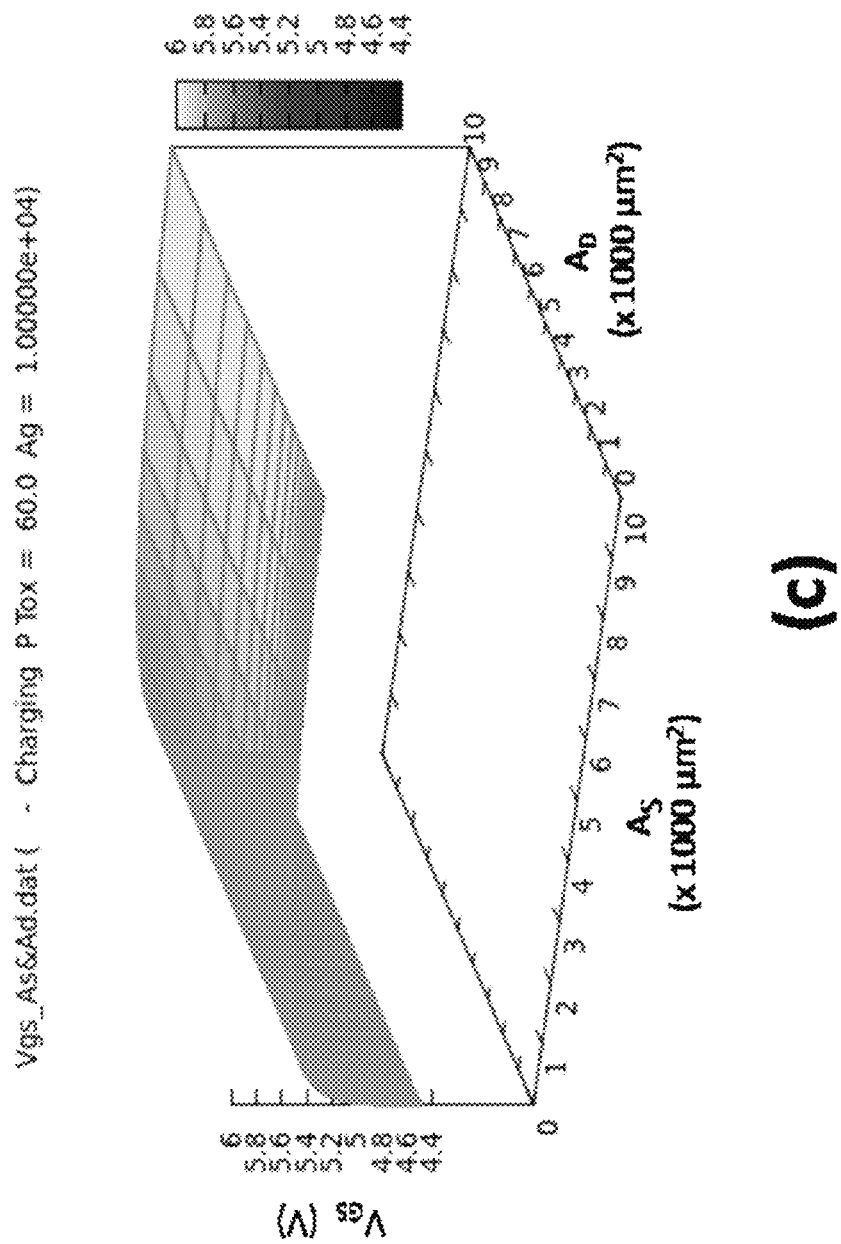
FIG. 8(c) shows simulated potential drop between gate and source terminals ($V_{GS}$) versus area of $M_6$ metal connected at source ($A_S$) and drain ($A_D$) of the Group-1 test transistor during a negative charging event according to one embodiment of the present disclosure.
Figure 8D:
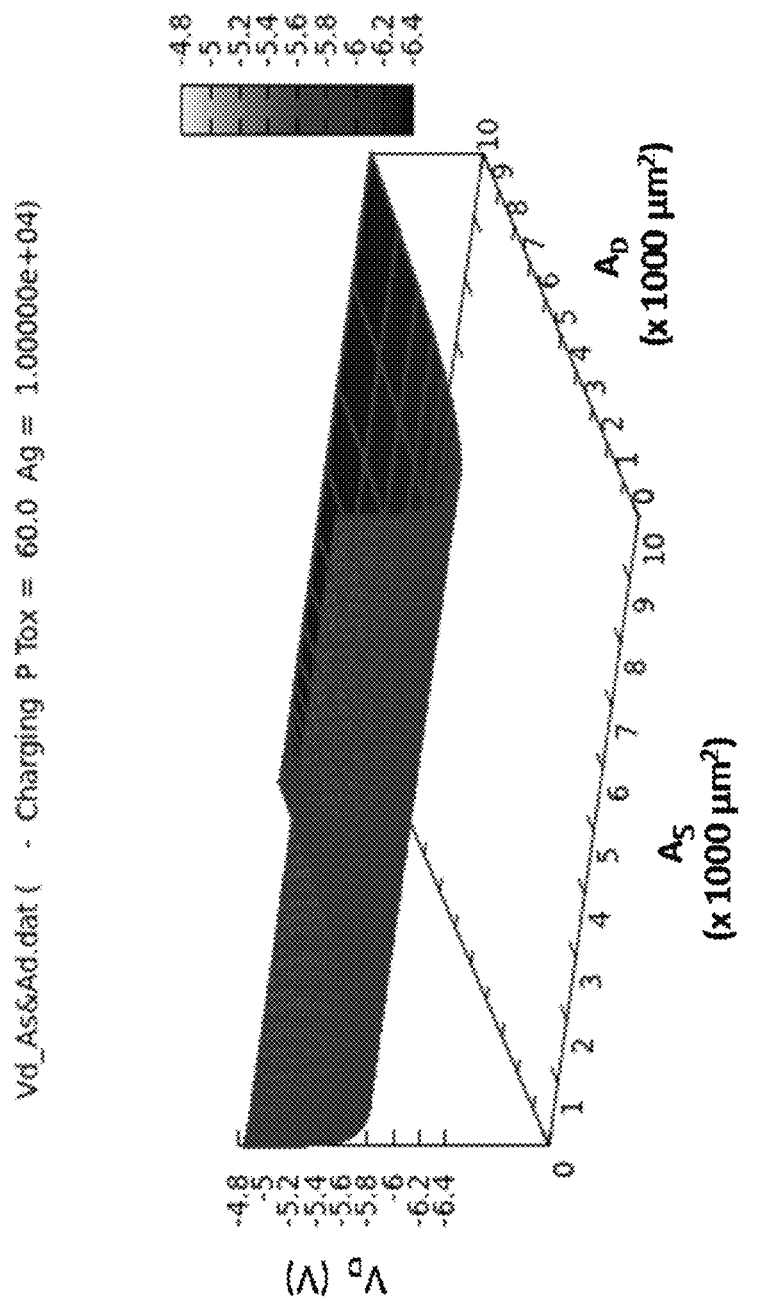
FIG. 8(d) shows simulated drain terminal potential ($V_D$) versus area of $M_6$ metal connected at source ($A_S$) and drain ($A_D$) of the Group-1 test transistor during a negative charging event according to one embodiment of the present disclosure.
Figure 8E:
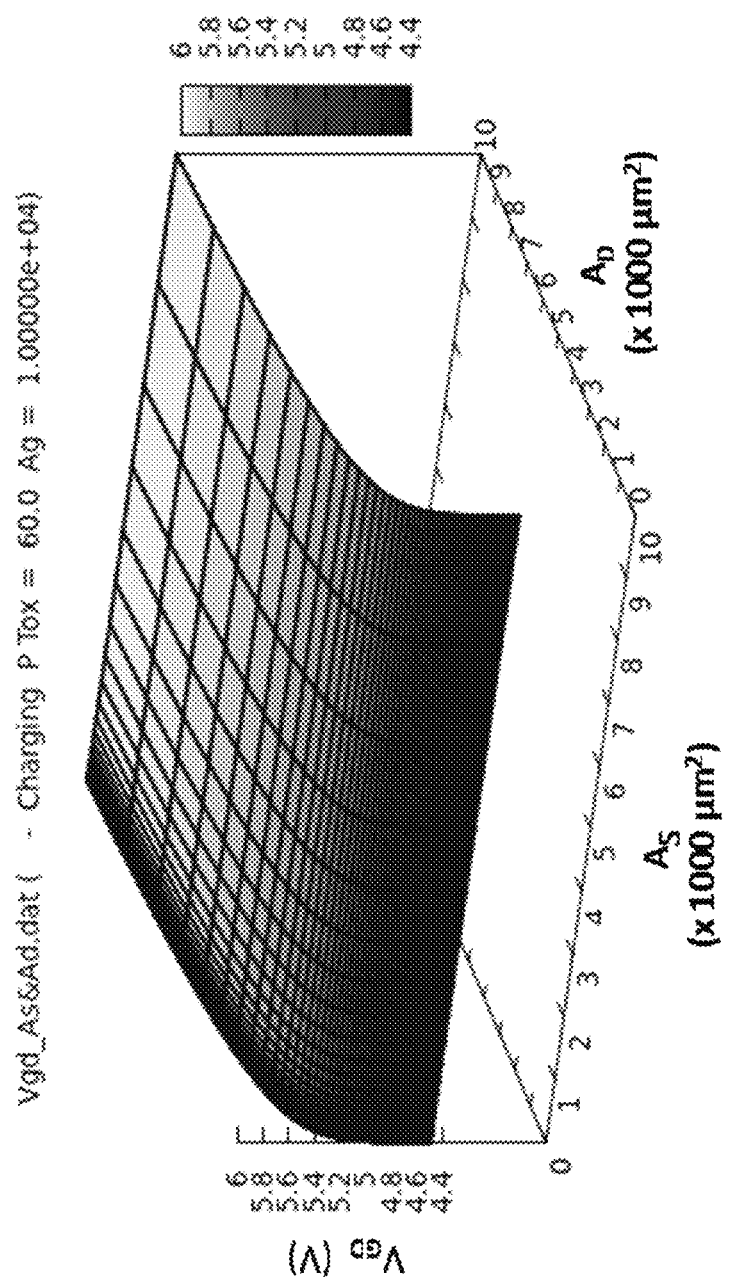
FIG. 8(e) shows simulated potential drop between gate and drain terminals ($V_{GD}$) versus area of $M_6$ metal connected at source ($A_S$) and drain ($A_D$) of the Group-1 test transistor during a negative charging event according to one embodiment of the present disclosure.
Figure 9:
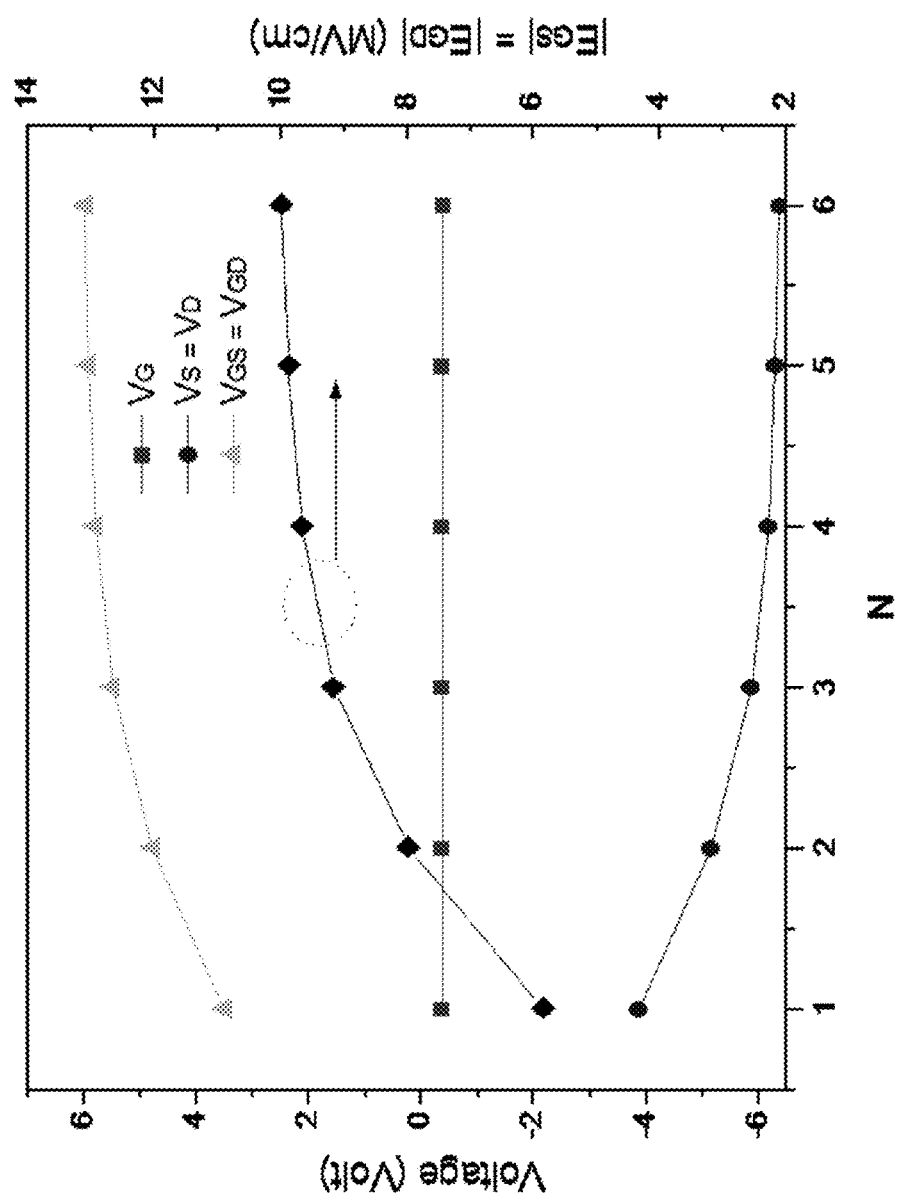
FIG. 9 shows simulated pad-etch induced bond-pad charging effect on $V_G$, $V_S$ (=$V_D$), $V_{GS}$ (=$V_{GD}$) and $E_G$ (=$E_{GD}$) versus number of total metal layers, N, in a given technology during a negative charging event according to one embodiment of the present disclosure.

FIG. 8(b) shows that the simulated $V_S$ increases from 4.8 to 6.4V (in absolute value) as $A_S$ increases from 0 to 10000 μm$^2$ while $A_D$ essentially has no effect on $V_S$ buildup. FIG. 8(c) shows that $V_{GS}$ increases from 4.4 to 6V, nearly independent of $A_D$, as $A_S$ increases from 0 to 10000 μm$^2$.

Note that as shown in FIG. 8(c), the maximum $V_{GS}$ is 6V at $A_G = A_D = A_S = A_{NW} = 10000$ μm$^2$ (bond pad area), corresponding to 10 MV/cm (=6V/60 Å) of the threshold electrical field for the gate oxide degradation. This is a result from the effort of adjusting $J_{SC}$ and $V_{OC}$ in matching the threshold of gate oxide degradation.

During the negative charging events, the Group-1 transistors are in the strong accumulation condition (i.e., $V_{GS} = V_G - V_S = -0.37 - (-6.37) = 6V >> -0.5V$ as the target threshold voltage). Because the transistor channel current is so low, there virtually is no communication between the transistor source and drain. As a result, $V_S$ essentially becomes only responsive to $A_S$ and $V_D$ may be only responsive to $A_D$. In addition, $V_D$ also follows $V_S$ due to the floating source and drain condition and the symmetry of the drain and source in the MOS transistor structure. Consequently, the behavior of $V_D$ and $V_{GD}$ versus $A_D$ and $A_S$ turns out to be symmetrical to that of $V_S$ and $V_{GS}$ versus $A_S$ and $A_D$. FIGS. 7(d) and 7(e) show the simulated $V_D$ and $V_{GD}$ charging behavior.

$V_C$ in the table in FIG. 7 stands for the voltage along the strongly accumulated surface (between source and drain) right below the gate oxide. The $V_C$ here is estimated to be close to $V_{NW}$ in the strong accumulation condition. The estimated $V_{GC}$ of −0.37V suggests that the gate oxide damage may be mainly at the gate oxides in the G-to-S and G-to-D overlap regions.

With the completion of the above $M_6$ bond pad charging simulation, the simulation process may next move to the lower-metal-layer bond pad charging. Simulations are performed on the $M_N$-layer bond pad charging with N=1 to 5 and with the same $J_{SC}$ and $V_{OC}$ used in the $M_6$ bond pad charging simulation. FIG. 8(a) shows $V_G$, $V_S$ (=$V_D$), $V_{GS}$ (=$V_{GD}$) and $E_{GS}$ (=$E_{GD}$) versus N. Based on $E_{GS}$ ($E_{GD}$) data and E-Field threshold of 10 MV/cm for the gate oxide breakdown, the risk of the reference transistor charging damage could decrease as the total number of metal layers decreases.

The trend here is caused by the reduction of the impedances between the bond pads and the wafer substrate when the total number of metal layers decreases. When N decreases, the total thickness of ILD layers stacked between the bond pads and the wafer substrate reduces accordingly which consequently reduces the ILD impedances there. As a result, the total impedance between the G, S, D, and NW terminals and the substrate are reduced since the bond-pad-to-substrate ILD impedance is one of the impedance components contributing the terminal-to-substrate impedances. The smaller S- and D-terminal-to-substrate impedances may further reduce the plasma potential coupling at the S and D terminals and hence lower $V_S$ and $V_D$. The smaller G- and NW-terminal-to-substrate impedances however have negligible effect on $V_G$ and $V_{NW}$. This is due to the fact that the gate potential is effectively pulled down to be close to the substrate potential by PD and the NW potential is also at the substrate potential because of the forward-biased NW-to-sub junction during the negative charging event. The above explains the trends of lowered $|V_{GS}|$ and $|V_{GD}|$ and hence reduced transistor gate oxide degradation risk as N decreases.

Figure 10:
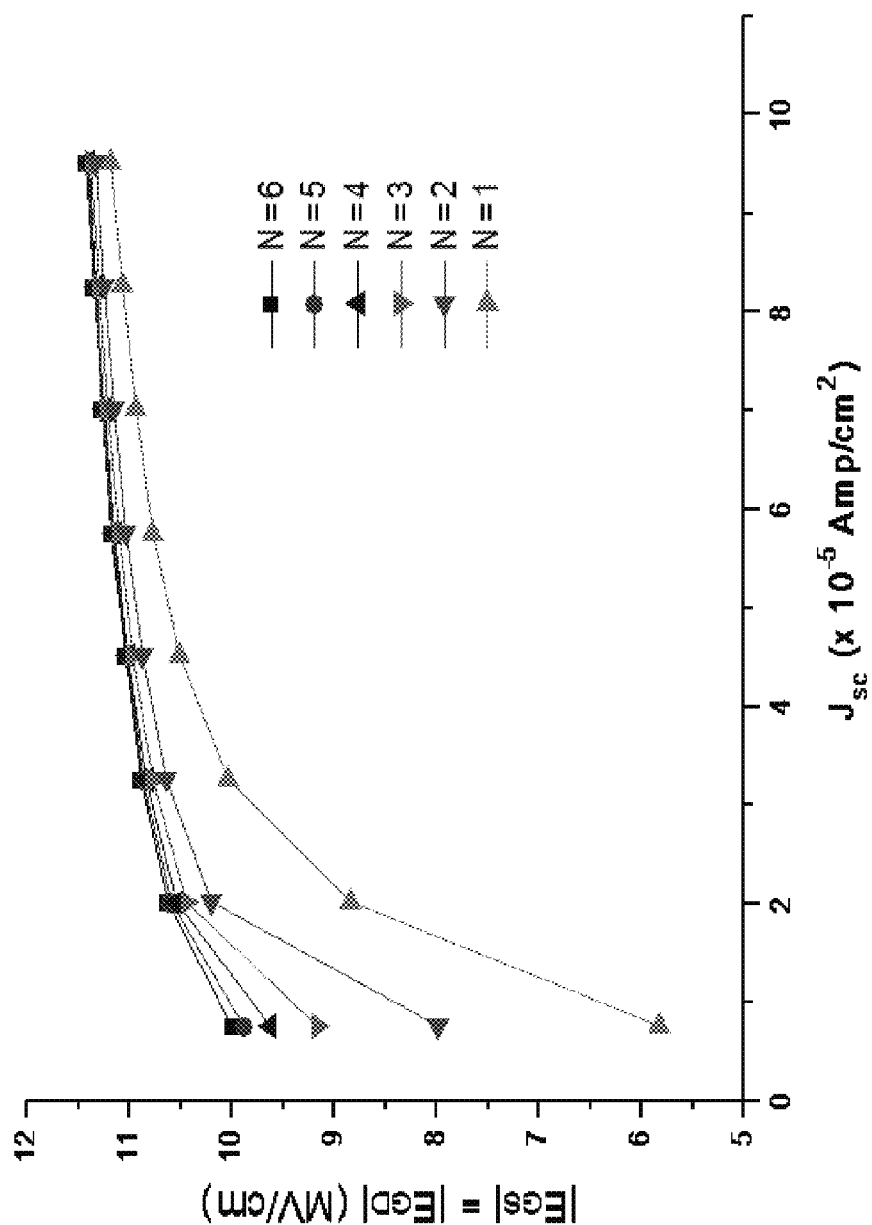
FIG. 10 shows simulated pad-etch induced bond-pad charging effect on $E_{GS}$ (=$E_{GD}$) versus short-circuit charging current density, $J_{SC}$, at different number of total metal layers in a given technology during a negative charging event according to one embodiment of the present disclosure.
Figure 12A:
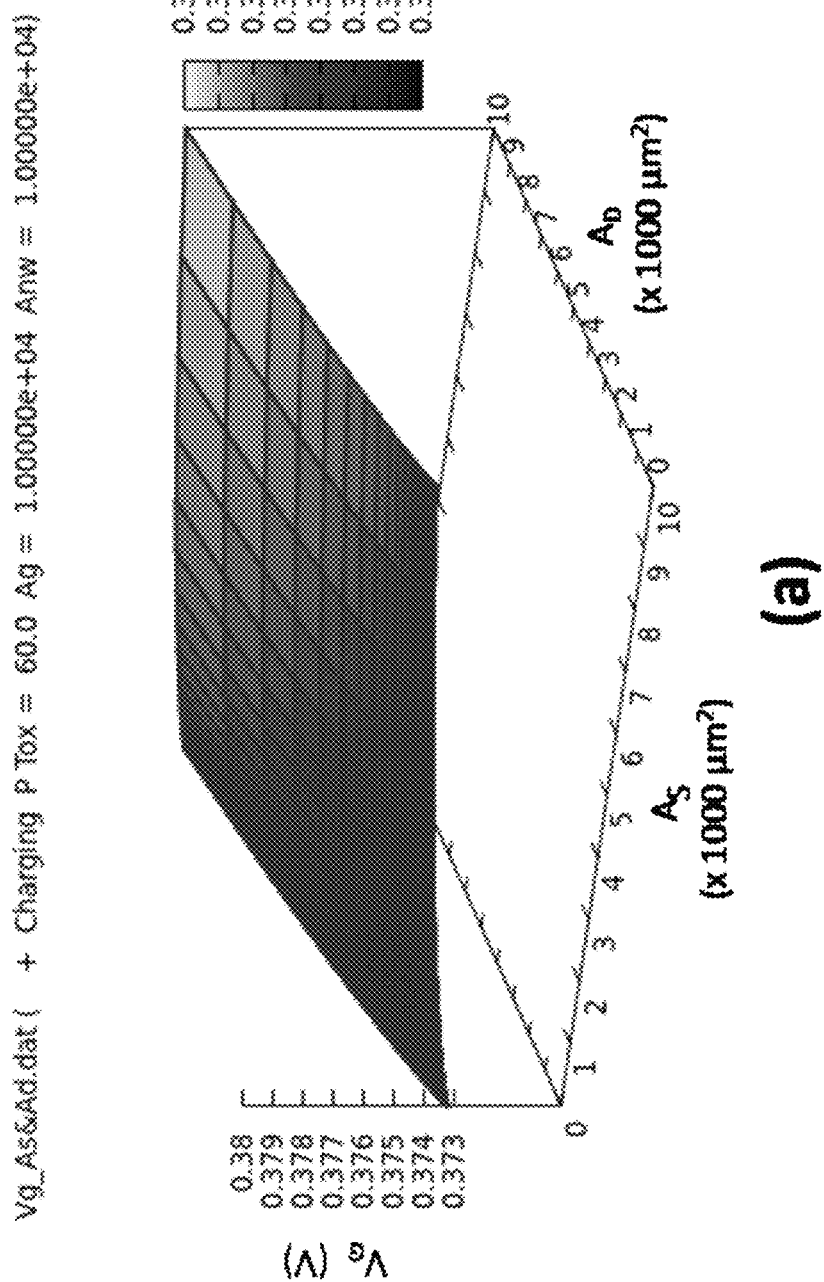
FIG. 12(a) shows simulated gate terminal potential ($V_G$) versus area of $M_6$ metal connected at source ($A_S$) and drain ($A_D$) of the Group-1 test transistor during a positive charging event according to one embodiment of the present disclosure.
Figure 12B:
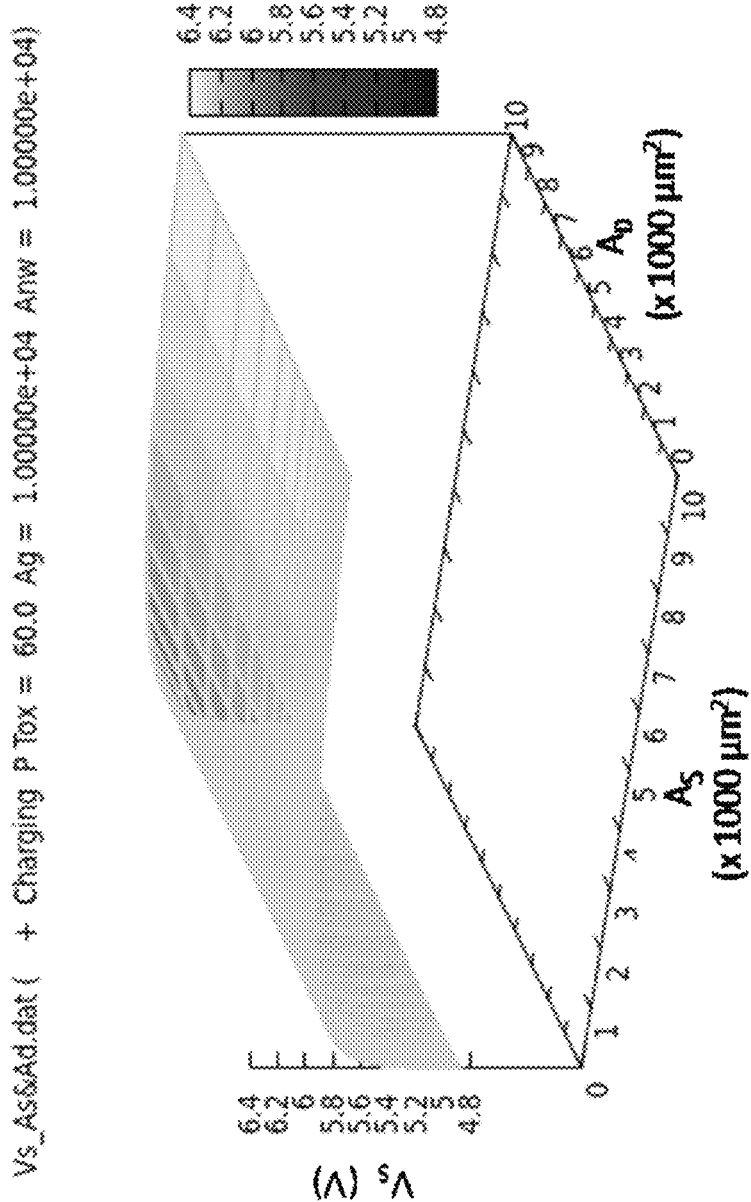
FIG. 12(b) shows simulated source terminal potential ($V_S$) versus area of $M_6$ metal connected at source ($A_S$) and drain ($A_D$) of the Group-1 test transistor during a positive charging event according to one embodiment of the present disclosure.
Figure 12C:
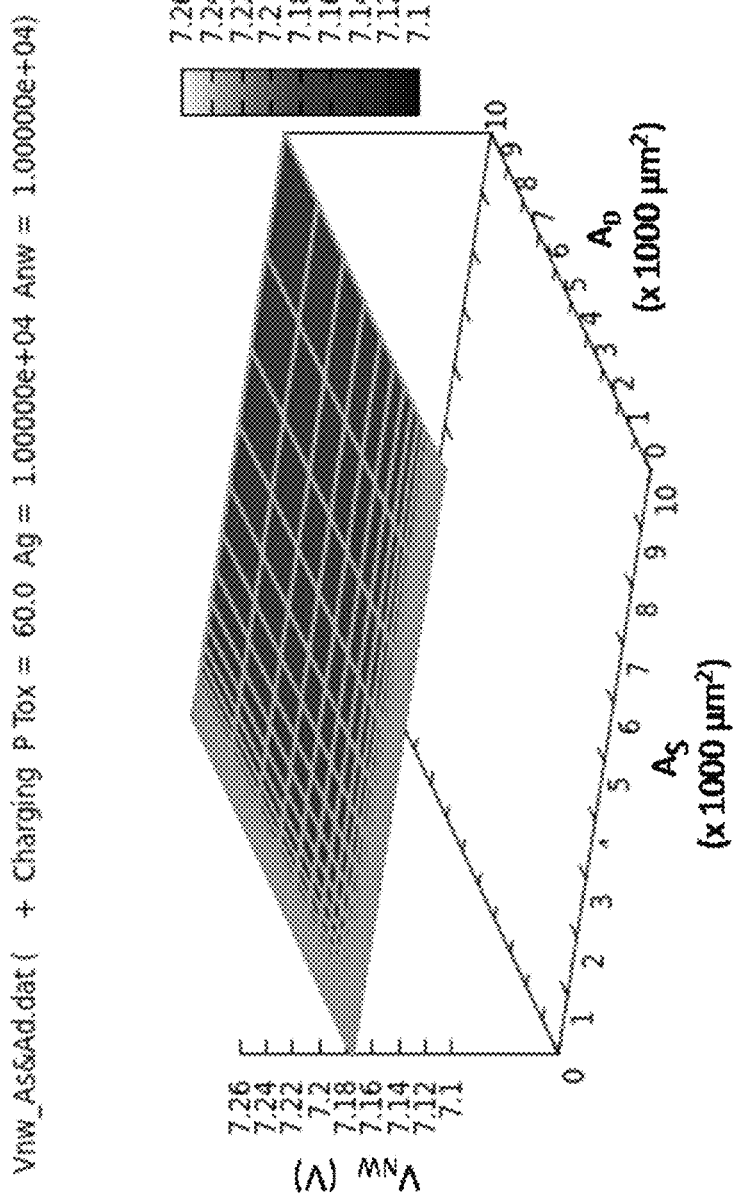
FIG. 12(c) shows simulated NW terminal potential ($V_{NW}$) versus area of $M_6$ metal connected at source ($A_S$) and drain ($A_D$) of the Group-1 test transistor during a positive charging event according to one embodiment of the present disclosure.
Figure 12D:
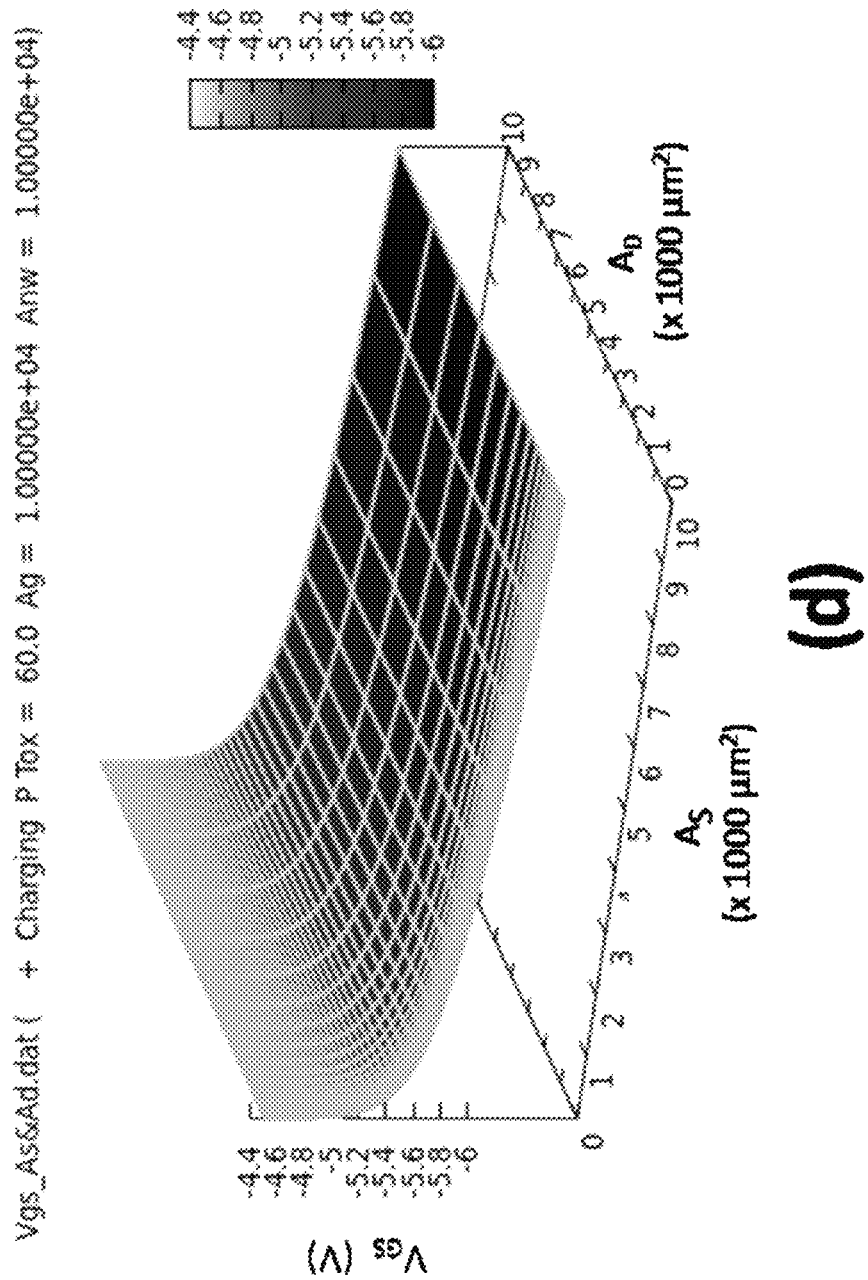
FIG. 12(d) shows simulated potential drop between gate and source terminals ($V_{GS}$) versus area of $M_6$ metal connected at source ($A_S$) and drain ($A_D$) of the Group-1 test transistor during a positive charging event according to one embodiment of the present disclosure.

FIG. 11 shows the result from the simulations that assess the impact of stronger charging source of pad-etch process. Higher charging current densities by increasing $J_{SC}$ from $7.5 \times 10^{-6}$ to $9.5 \times 10^{-5}$ Amp/cm$^2$ are used in the corresponding simulations. The result shows that the structure having a less total number of metal layers will experience less risk of the gate oxide degradation due to the bond pad charging by the pad-etch process. However, if the charging source of the pad-etch is too strong, reducing the total number of the metal layers could not even protect the transistor gate oxides from being damaged. In FIG. 10, it is clearly shown that the one-metal-layer structure will begin to reach the transistor gate oxide degradation threshold at $J_{SC}$ around $3 \times 10^{-5}$ Amp/cm². The trend here indicates that advanced process nodes nowadays such as 28 nm, 20 nm, 16 nm and beyond which introduce more metal layers in order to connect more transistors in the chip will be more susceptible to the pad-etch induced bond-pad charging effect.

FIG. 7 shows that for the Group-2 test transistors, the gated diode attached to all four transistor terminals at the $M_6$ layer where the bond pads are placed work effectively during the negative charging event. The terminal voltages are all down to 0.37V resulting in zero inter-terminal voltage drops. This suggests that there will be no damage to the gate oxides of the Group-2 reference transistor test structures. The same higher-$J_{SC}$ simulations performed in the Group-1 reference transistors are also performed in the Group-2 reference transistors. The same zero inter-terminal voltage drops and hence no damage (charging-free) to the gate oxides may be acknowledged.

Positive-Charging Result

In the positive-charging simulations, the same set of $J_{SC}$ and $V_{OC}$ used in the negative-charging simulations may also lead to the terminal condition at the transistor gate oxide degradation for the Group-1 transistor test structures. The table in FIG. 11 summarizes the effect of the positive charging on the two transistor groups. Note that the NW-to-sub junction of the transistors test structures is reverse-biased to differentiate the charging behavior in the positive charging event from that of the negative charging event.

FIGS. 12(a) to 12(d) show 3-D plots of the simulated $V_G$, $V_S$, $V_{NW}$ and $V_{GS}$ versus $A_S$ and $A_D$ at the $M_6$ layer for the Group-1 transistors during the positive charging event at the end of the pad-etch process. $A_G$ and $A_{NW}$ at the Me layer are both 10000 μm².

For the Group-1 transistors, the protection device pulls down $V_G$ to 0.38V while the floating drain and source bond pads are charged up to 6.38V, driving the transistor into the strong inversion condition (i.e., $V_{GS}=V_G-V_S=0.38-6.38=-6V<<-0.5V$ of the targeted threshold voltage). The reverse-biased NW bond pad is charged up to 7.18V. The S-to-NW and D-to-NW junction are reverse-biased at −0.8V (i.e., $V_S-V_{NW}=V_D-V_{NW}=6.38-7.18=-0.8V$) and the NW-to-sub junction is reverse-biased at 7.18V. $V_C$ is at $V_S$ and $V_D$ values in the strong inversion condition. Consequently, $V_{GS}$, $V_{GD}$, and $V_{GC}$ may be at −6V corresponding to 10 MV/cm as the E-field threshold of the gate oxide degradation. These voltages are sufficient to damage the transistor gate oxides in the G-to-S, G-to-D and G-to-Channel (G-to-C) overlap regions.

For the Group-2 reference transistor test structures, FIG. 11 indicates that all four transistor terminal voltages at the $M_6$ layer are effectively pulled down to 0.37V by the protected gated diodes. This leads to zero inter-terminal voltages and therefore the damage risk to the gate oxides of the Group-2 reference transistor test structures may not be expected to happen (i.e., the Group-2 reference transistor test structures are charging-free).

It is noted here that similar to the negative charging case, the positive-charging simulations once again suggest the symmetrical charging behavior between $V_S$ and $V_D$ and between $V_{GS}$ and $V_{GD}$ even in the condition of the transistor being driven into the strong inversion. For the simplified illustration purpose, $V_D$ and $V_{GD}$ versus $A_S$ and $A_D$ data are not shown here. This again is attributed to the floating source and drains, the symmetrical nature of the source and drain terminals in the MOSFET structure and the transistor channel current being limited by the transistor internal junction currents. $V_D$ may be the same as $V_S$ even when the transistor is in strong inversion.

Figure 13:
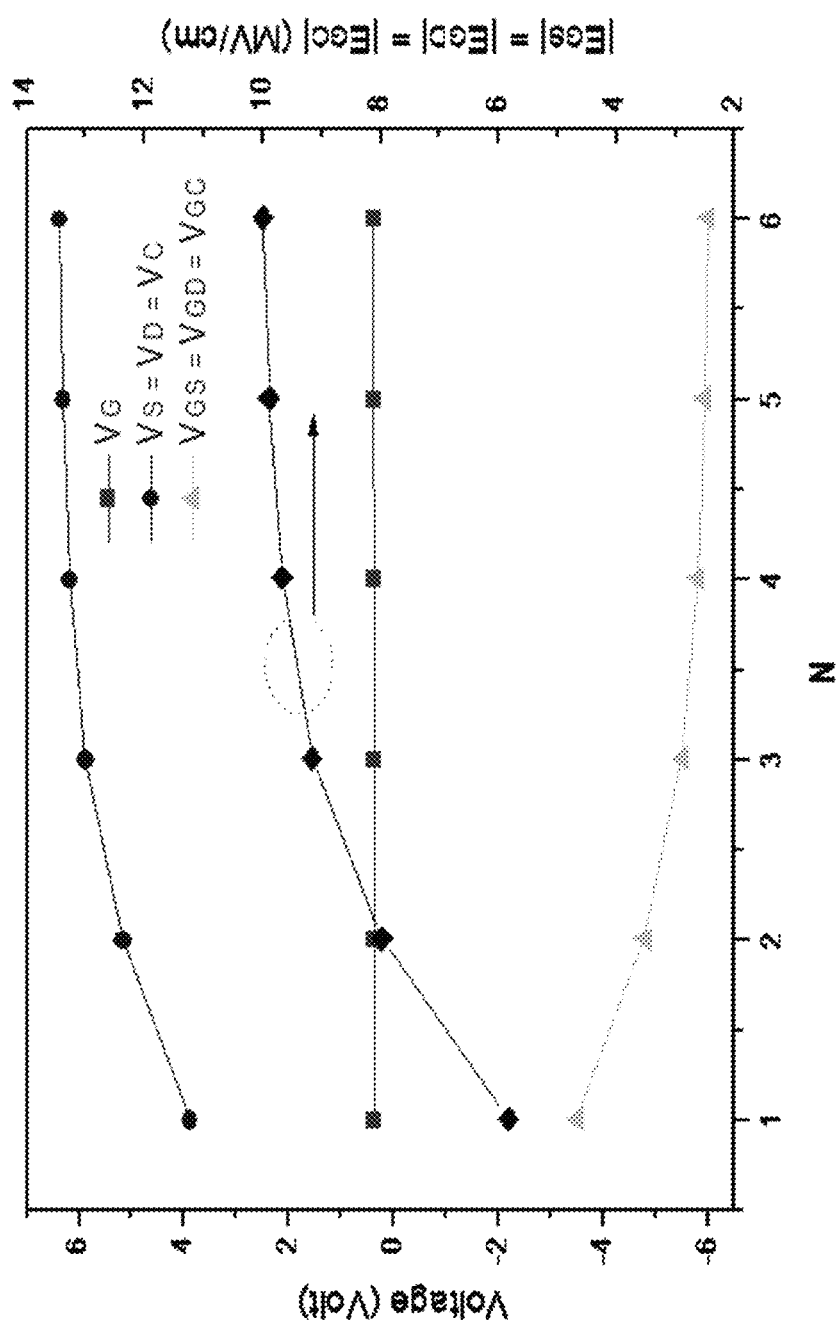
FIG. 13 shows simulated pad-etch induced bond-pad charging effect on $V_G$, $V_S$ (=$V_D$), $V_{GS}$ (=$V_{GD}$=$V_{GC}$) and $E_{GS}$ (=$E_{GD}$=$E_{GC}$) versus number of total metal layers, N, in a given technology during a positive charging event according to one embodiment of the present disclosure.

FIG. 13 shows the bond pad charging performance trend with $V_G$, $V_S(=V_D)$, $V_{GS}(=V_{GD}=V_{GC})$ and $E_{GS}(=E_{GD}=E_{GC})$ versus N (=1 to 6) for the Group-1 transistors in the positive charging event, where N is the number of total metal layers. The $J_{SC}$ and $V_{OC}$ used in the $M_6$ bond pad charging simulations are used in the lower-metal-layer bond pad charging simulations. Based on the E-Field threshold of 10 MV/cm for the gate oxide degradation, the risk of the charging damage to the reference transistor decreases with the decreasing number of total metal layers. This is a conclusion similar to the negative charging event case. The reason that explains the trend in the negative charging case is applicable in the positive charging case here. For the Group-2 transistors, the trend may indicate that for the structure with 1 to 5 metal layers may remain charging-free as in N=6 ($M_6$) case.

The above verification analysis suggests that the large threshold voltage shift observed experimentally in the Group-1 transistors could be attributed to (i) the degradation of the gate oxide in the G-to-S and G-to-D overlap regions during the negative charging event and (ii) the degradation of the gate oxide in its entire region (G-to-S, G-to-D and G-to-C overlap regions) during the positive charging event. In contrast, the gate oxides in the fully protected Group-2 test transistors are truly charging-free because they are immune from any possible charging damage in both positive and negative charging events. As aforementioned, a complete charging performance evaluation must consider both positive and negative charging events because either or both may exist during the entire ILD (for lower metal layers) and nitride (for top metal-layer bond pads) deposition or etch-back process. In view of above, the gate oxide in the G-to-S and G-to-D overlap regions apparently may be susceptible to higher risk of the degradation than the gate oxide in the G-to-C overlap region in the Group-1 transistor test structures.

The simulation verification taking into account the multiple-terminal transistor charging and the ILD process induced charging mechanisms verifies that the reference transistor test structures designed by the prior-art method for the bond-pad charging protection is inadequate to serve as reference transistor test structures due to their high susceptibility to the transistor gate oxide degradation.

The simulation verification also reveals that reducing source and drain bond pad size can alleviate the charging risk to which the transistor gate oxides may subject. For the data shown in FIGS. 7(c) and 7(e), a reduction of source and drain bond pad area to 1000 μm² or below would reduce substantially the E-field across the gate oxide in the G-to-S and G-to-D overlap regions. However, this will lead to quite small source and drain bond pads which would be impractical in use. Thus, the fully-protected Group-2 transistors are proven to be truly charging-free reference transistor test structures for practical use. Their bond-pad protection design of using four protection devices (PDs) and four fuse pads, however, can be simplified in another embodiment where only one PD is employed.

Figure 14:
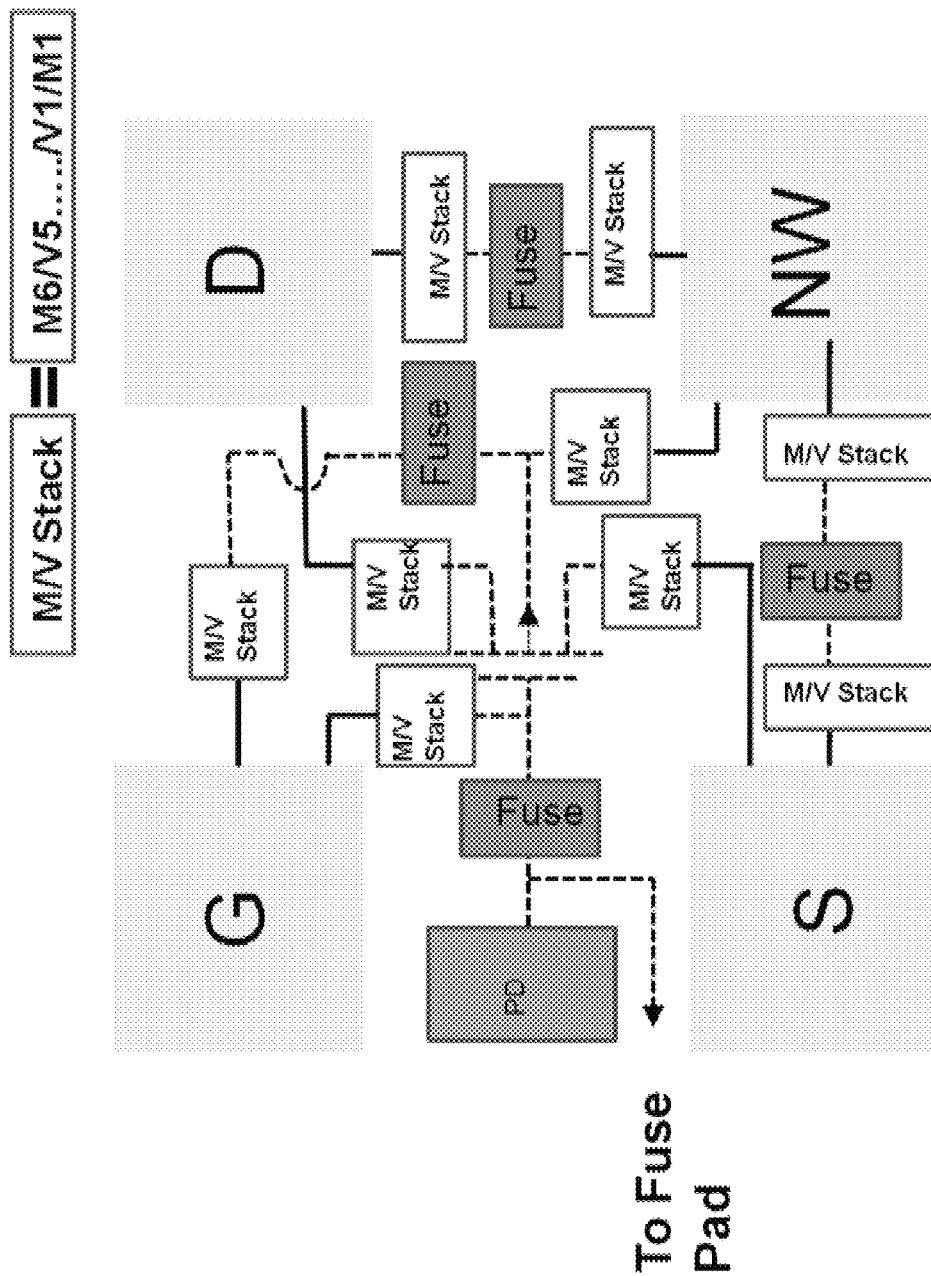
FIG. 14 shows a top view of the $M_6$ bond pad design for the recommended charging-free reference transistor test structures according to one embodiment of the present disclosure.

FIG. 14 shows the top view of such simplified design in which only one PD is used, which is connected at the PMOS transistor gate through a fuse. Four fuses, each connected to one transistor terminal, are still required in such configuration. However, only one fuse pad which is located between the protection device and the fuse directly connected to the transistor gate is required. For the remaining three fuses, they may be indirectly connecting to gate, drain and source terminals (for example, through the pad), with the other ends of them connecting to the NW pad or terminal. Such configuration renders possible using the existing 4 bond pads in the zap-off process of the above three fuses without introducing extra fuse pad(s). For example, to zap off the fuses between the gate and NW, drain and NW and source and NW pad, one can simultaneously apply a negative bias such as a −4V to the gate, drain and source pads and a ground bias to the NW pad. The same bias at the gate, drain and source pads ensures no stress on the gate oxide in the transistor G-to-S and G-to-D overlap regions during the fuse zap-off process. The −4V at the gate pad and the ground bias at the NW pad together may drive the transistor into depletion condition (i.e., $V_{GS}$=0V). This substantially reduces the voltage across the gate oxide in the G-to-C overlap region, therefore minimizing the gate oxide stress due to the existence of a depletion region underneath the gate channel which takes away a large portion of the voltage drop between the gate and NW pads. The design here with one protection device and one fuse pad also ensures a minimum usage of the layout space.

Note that for the original bond-pad design of the Group-2 reference transistor test structures, the fuses and associated fuse pads may be eliminated if (i) the global turn-off method for the protections devices (This method was disclosed by the inventor of this application, Wallace Lin, on a US patent titled "Method for Protecting Circuits from Damage Due to Currents and Voltages During Manufacture," U.S. Pat. No. 7,974,055 issued on Jul. 5, 2011.) or (ii) the method of shunting away the protection device leakages (This method was disclosed by the inventor of this application, Wallace Lin, on a paper titled "A new technique for measuring gate-oxide leakage in charging protected MOSFETs," published in Journal of IEEE Trans. Electron Devices, vol. 54, no. 4, pp. 683-691, April 2007.) can be integrated. The method of the former may be easier to implement than the latter which requires special layout design considerations. Although the design in the present disclosure may introduce more metal contact/via stacks and fuses, the use of the layout space is far less than that with three extra PDs and three extra fuse pads.

Figure 15:
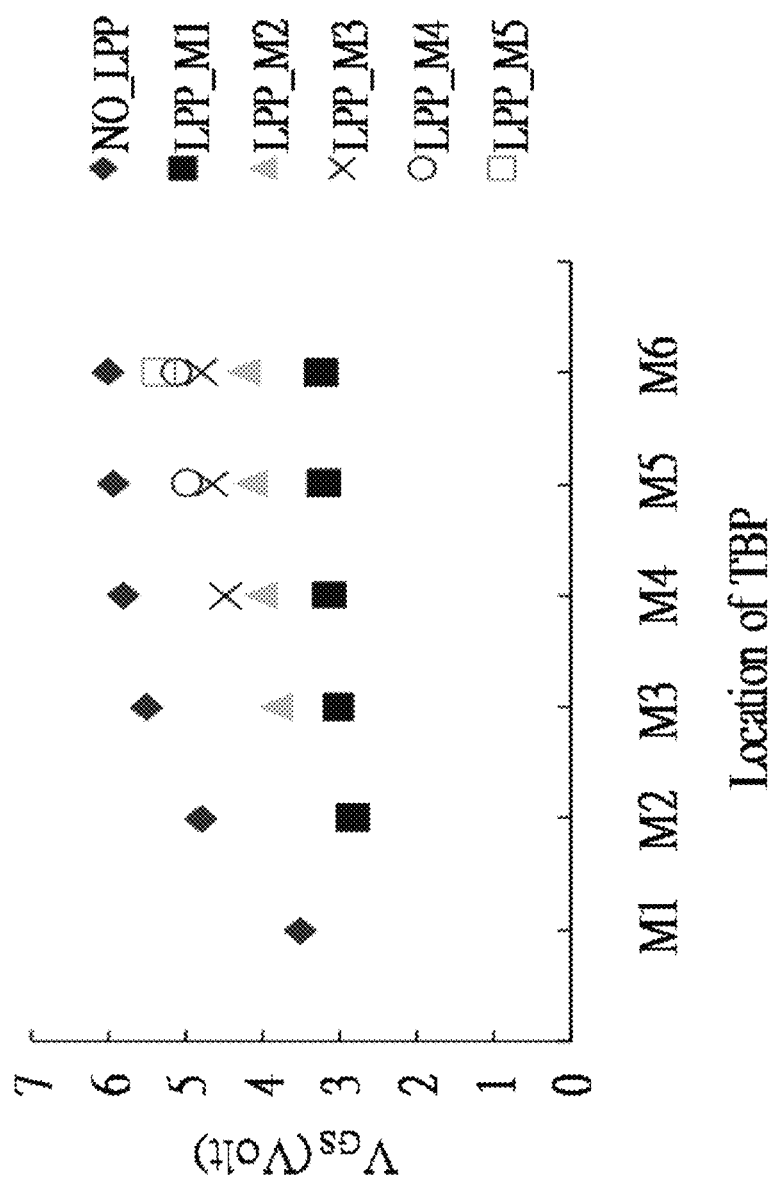
FIG. 15 shows simulated $V_{GS}$ of Group-1 reference transistor test structures versus location of top-metal-layer bond pads during a negative charging event under the condition of different location of inserted lower-metal-layer probing pads according to one embodiment of the present disclosure.

It is important to note that for the monitoring purpose during the IC back-end manufacturing process, inline probing pads of certain or even all lower metal layers are often inserted into the test structures during the layout stage. For the transistor test structures dedicated to the charging signal monitoring, this unintentional but common practice in the industry however confounds and obscures the charging signals to be monitored. FIG. 15 shows the simulated $V_{GS}$ of Group-1 transistor test structures versus location of top-metal-layer bond pads (TBP) during the negative charging event under the condition of lower-metal-layer probing pads (LPP) being inserted beneath the TBPs at the four terminals of the transistors. The LPPs have the same area of 100 μm×100 μm as the TBPs in one embodiment. One can see the lowest inserted pads (M1 pads) may reduce nearly half of $V_{GS}$ compared to the case without insertion of any lower inline probing pads (NO_LPP). The higher the location of the LPPs, the less the reduction in $V_{GS}$ could result. Therefore, depending on where the inline LPPs are located, these pads will serve extra or alternative charging protection alongside the M1 probing pads providing the best protection. This phenomenon is caused by the reduction of impedances between the transistor terminals and the substrate.

The data in FIG. 15 indicates that the inline pads obscure the actual charging signal of the test structures by reducing the reverse-mode gate charging effect, and as a result, the gate oxide damage in the Group-1 transistor test structures can be lessened substantially. The Group-1 transistors should suffer no damage if low inline probing pads such as $M_1$ pads exist. In such scenario, the Group-1 transistor test structures may serve as reference transistors for benchmarking the transistor performance, however, they may never function as the charging-free reference transistors when the potential drop across their gate oxides during the charging events is non-zero (e.g., $V_{GS}$ in LPP_M1 case in FIG. 15 is non-zero). In contrast, the potential drop across the gate oxides of the Group-2 reference transistors could be all zero during the charging events, regardless of whether the inline probing pads are inserted or not beneath the top-metal-layer bond pads. Based on the above analysis, the Group-2 test structures may be more reliable and truly function as the charging-free reference transistor test structures.

Based on the above analysis and conclusion, the optimum bond-pad charging-protection design for the charging-free reference transistor test structures with both the minimum usage in layout space and minimum gate oxide stress in the fuse zap-off process is shown in FIG. 14 where the top view of the configuration of the bond pad is presented.

In typical circuit design, various amount of the metals connected to transistor terminals may exist in the lower metal layers. Thus, when the IC back-end manufacturing process proceeds to the higher metal layers, these lower-layer metals can serve as the protection for the transistors to some degree, just similar to the Group-1 transistor test structures with inserted lower inline probing pads. Therefore, the transistors in circuits in general are more or less protected during the back-end process due to these lower-layer metals. Nonetheless, for those transistors with their terminals connecting to few or even no lower-layer metals, the Group-1 test structures as previously mentioned may be inadequate in protecting the transistors, especially if their gates are interconnected at the higher metal layers to highly efficient leakage paths such as protection devices, N-type S/D diffusion regions, VSS bus lines, etc. These highly efficient leakage paths are likely to pull the transistor gates to a low potential during the backend IC manufacturing process, hence triggering the reverse-mode charging mechanism and damaging the transistor gate oxides.

Finally, the passivation material and its corresponding deposition and etch-back process steps before the EOL are quite standard in the conventional process such as the 0.13-μm process on which the experimental data of this study are based and in the advanced process such as 20 nm, 14 nm or below. In addition, the underlying physical mechanisms of the ILD and nitride deposition and etch-back induced transistor charging phenomena are fundamental and universal to the above process. It is expected that the models, the simulation strategy, the analysis and the conclusion of the present disclosure can apply to a wide span of the process including sub-14 nm ones.

What is claimed is:

1. A method for preparing a reference transistor test structure having a transistor having multiple terminals, comprising:

placing a set of bond pads at a first layer of the reference transistor test structure with each of the bond pads connecting to its corresponding terminal of the transistor, wherein the first layer of the reference transistor test structure is an uppermost metal layer; and placing a first protection device at a second layer of the reference transistor test structure and connecting the first protection device to at least one of the terminals of the transistor, wherein the second layer is a lowermost metal layer.

2. The method according to claim 1, further comprising connecting the terminal to the bond pad at the first layer with a via at a third layer and a metal contact corresponding to the terminal, wherein the metal contact is a poly-silicon contact between the second layer and a transistor poly layer when the terminal connected to the metal contact is a gate terminal, the metal contact is a first diffusion contact between the second layer and a transistor source diffusion layer when the terminal connected to the metal contact is a source terminal, the metal contact is a second diffusion contact between the second layer and a transistor drain diffusion layer when the terminal connected to the metal contact is a drain terminal, and the metal contact is a third diffusion contact between the second layer and a transistor well diffusion layer when the terminal connected to the metal contact is a transistor well.

3. The method according to claim 1, further comprising placing a second protection device and connecting the second protection device to at least one of the terminals not connected to the first protection device.

4. The method according to claim 1, further comprising enabling the bond pads of the reference transistor test structure to be grounded for a charging evaluation of the reference transistor test structure in a plasma-involved charging event.

5. The method according to claim 4, further comprising connecting a fuse between the terminal and the first protection device and disconnecting the fuse between the terminal and the first protection device after the charging evaluation completes.

6. The method according to claim 5, further comprising disposing a fuse pad at the first layer and connecting the fuse pad with the fuse connecting to at least one of the terminals of the transistor.

7. The method according to claim 1, further comprising disposing an inter-level dielectric layer between the first layer and the second layer.

8. The method according to claim 1, further comprising disposing a nitride layer above the first layer and selectively etching the nitride layer, wherein a largest amount of charging occurs when disposing the nitride layer starts or etching the nitride layer concludes.

9. The method according to claim 1, further comprising disposing the transistor beneath the second layer.

10. The method according to claim 1, further comprising setting a size of the bond pads at 100 micrometers by 100 micrometers.

11. A reference transistor test structure, comprising:
a set of bond pads at a first layer of the reference transistor test structure with each of the bond pads connecting to its corresponding terminal of the transistor, wherein the first layer of the reference transistor test structure is an uppermost metal layer; and
a first protection device at a second layer of the reference transistor test structure, wherein the first protection device is connected to at least one of the terminals of the transistor, and the second layer is a lowermost metal layer.

12. The reference transistor structure according to claim 11, further comprising a via at a third layer and a metal contact corresponding to the terminal, wherein the terminal is connected to the bond pad through the metal contact and the via, the metal contact is a poly-silicon contact between the second layer and a transistor poly layer when the terminal connected to the metal contact is a gate terminal, the metal contact is a first diffusion contact between the second layer and a transistor source diffusion layer when the terminal connected to the metal contact is a source terminal, the metal contact is a second diffusion contact between the second layer and a transistor drain diffusion layer when the terminal connected to the metal contact is a drain terminal, and the metal contact is a third diffusion contact between the second layer and a transistor well diffusion layer when the terminal connected to the metal contact is a transistor well.

13. The reference transistor structure according to claim 11, further comprising a second protection device connected to at least one the terminals not connected to the first protection device.

14. The reference transistor structure according to claim 11, wherein the bond pads are grounded for a charging evaluation of the reference transistor test structure in a plasma-involved charging event, with the bond pads floating before the charging evaluation starts.

15. The reference transistor structure according to claim 14, further comprising a fuse between the terminal and the first protection device wherein the fuse between the terminal and the first protection device is disconnected after the charging evaluation completes.

16. The reference transistor structure according to claim 15, further comprising a fuse pad disposed at the first layer wherein the fuse pad is connected with the fuse, which is connected to at least one of the terminals of the transistor.

17. The reference transistor structure according to claim 11, further comprising an inter-level dielectric layer disposed between the first layer and the second layer.

18. The reference transistor structure according to claim 11, further comprising a nitride layer disposed above the first layer, which is selectively etched, wherein a largest amount of charging occurs when disposing the nitride layer starts or etching the nitride layer concludes.

19. The reference transistor structure according to claim 11, wherein the transistor is disposed beneath the second layer.

20. The reference transistor structure according to claim 11, wherein the bond pads are 100 micrometers by 100 micrometers in size.

* * * * *